US012628343B2

(12) United States Patent
Park et al.

(10) Patent No.: US 12,628,343 B2
(45) Date of Patent: May 12, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Kyeonghoon Park, Suwon-si (KR); Inhwan Baek, Suwon-si (KR); Jaebok Baek, Suwon-si (KR); Jeehoon Han, Suwon-si (KR); Seungyoon Kim, Suwon-si (KR); Heesuk Kim, Suwon-si (KR); Byoungjae Park, Suwon-si (KR); Jongseon Ahn, Suwon-si (KR); Jumi Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 425 days.

(21) Appl. No.: 18/116,434

(22) Filed: Mar. 2, 2023

(65) Prior Publication Data
US 2023/0380164 A1     Nov. 23, 2023

(30) Foreign Application Priority Data
May 23, 2022     (KR) ......................... 10-2022-0062681

(51) Int. Cl.
*H10B 43/27*       (2023.01)
*H10B 41/27*       (2023.01)
(Continued)

(52) U.S. Cl.
CPC ............. *H10B 43/27* (2023.02); *H10B 41/27* (2023.02); *H10B 41/41* (2023.02); *H10B 43/40* (2023.02)

(58) Field of Classification Search
CPC . H01L 23/522; H01L 23/5226; H01L 23/528; H10B 41/10; H10B 41/20;
(Continued)

(56) References Cited

U.S. PATENT DOCUMENTS 9,601,577 B1 *   3/2017   Lee .................... H10D 84/0144
2015/0263011 A1   9/2015   Hong
(Continued)

FOREIGN PATENT DOCUMENTS

KR       20150106660 A     9/2015
KR       20180014911 A     2/2018
(Continued)

OTHER PUBLICATIONS

"European Search Report in Corresponding Application No. 23171383. 5, mailed Nov. 3, 2023, 9 pages".

*Primary Examiner* — Brook Kebede
(74) *Attorney, Agent, or Firm* — Wolf, Greenfield & Sacks, P.C.

(57)     ABSTRACT

A semiconductor memory device includes: a first semiconductor structure including a first substrate, circuit devices on the first substrate, and a lower interconnection structure connected to the circuit devices; and a second semiconductor structure on the first semiconductor structure. The second semiconductor structure may include: a second substrate having a first region and a second region; a substrate insulating layer extending through the second substrate; a landing pad extending through the substrate insulating layer; gate electrodes, each having a gate pad region on the second region having an exposed upper surface; and a gate contact plug extending through the gate pad region of at least one of the gate electrodes and into the landing pad. The landing pad may include a pad portion that is surrounded by an internal side surface of the substrate insulating layer, and a via (Continued)

portion extending from the pad portion to the lower interconnection structure.

20 Claims, 28 Drawing Sheets

(51) Int. Cl.
   *H10B 41/41*           (2023.01)
   *H10B 43/40*           (2023.01)
(58) Field of Classification Search
   CPC ........ H10B 41/27; H10B 41/35; H10B 41/50;
                H10B 41/41; H10B 43/10; H10B 43/20;
                H10B 43/27; H10B 43/35; H10B 43/40;
                           H10B 43/50; G11C 5/06
   See application file for complete search history.

(56) References Cited

U.S. PATENT DOCUMENTS

| | | | |
|---|---|---|---|
| 2018/0040553 | A1 | 2/2018 | Tak et al. |
| 2019/0067182 | A1 | 2/2019 | Lee |
| 2019/0326316 | A1 | 10/2019 | Son et al. |
| 2020/0168622 | A1 | 5/2020 | Fukuzumi et al. |
| 2020/0411542 | A1* | 12/2020 | Yang ...................... H10B 41/27 |
| 2021/0057430 | A1 | 2/2021 | Lee |
| 2021/0090994 | A1 | 3/2021 | Noh et al. |
| 2021/0193672 | A1 | 6/2021 | Kim et al. |
| 2021/0313343 | A1 | 10/2021 | Jung |
| 2021/0320125 | A1 | 10/2021 | Shin et al. |
| 2021/0375901 | A1 | 12/2021 | Oh et al. |
| 2022/0045083 | A1 | 2/2022 | Sim et al. |
| 2022/0384467 | A1* | 12/2022 | Kim ...................... H10B 43/27 |

FOREIGN PATENT DOCUMENTS

| | | | |
|---|---|---|---|
| KR | 20190024579 | A | 3/2019 |
| KR | 20190122372 | A | 10/2019 |
| KR | 20210023291 | A | 3/2021 |
| KR | 20210036134 | A | 4/2021 |
| KR | 10-2021-0066763 | A | 6/2021 |
| KR | 10-2021-0079087 | A | 6/2021 |
| KR | 20210080571 | A | 6/2021 |
| KR | 10-2021-0121335 | A | 10/2021 |
| KR | 20210124836 | A | 10/2021 |
| KR | 20210125268 | A | 10/2021 |
| KR | 20210147687 | A | 12/2021 |
| KR | 10-2022-0039970 | A | 3/2022 |
| KR | 10-2022-0057896 | A | 5/2022 |

* cited by examiner

A

C

A

D

E

III-III'

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2022-0062681 filed on May 23, 2022, in the Korean Intellectual Property Office, and the entire contents of the above-identified application are incorporated by reference herein.

BACKGROUND

The present disclosure relates to semiconductor devices and data storage systems including the same.

In data storage systems that use or require data storage, there is increasing demand for semiconductor devices which may store high-capacity data. Accordingly, research into methods of increasing data storage capacity of a semiconductor device has been conducted. For example, a semiconductor device including three-dimensionally arranged memory cells, rather than two-dimensionally arranged memory cells, has been proposed as a method of increasing data storage capacity of a semiconductor device.

SUMMARY

Aspects of the present disclosure provide semiconductors device having improved productivity and electrical characteristics and data storage systems including the same.

According to some example embodiments, a semiconductor device includes: a first semiconductor structure including a first substrate, circuit devices on the first substrate, and a lower interconnection structure connected to the circuit devices; and a second semiconductor structure on the first semiconductor structure. The second semiconductor structure may include: a second substrate having a first region and a second region; a substrate insulating layer that extends through the second substrate; a landing pad that extends through the substrate insulating layer; gate electrodes spaced apart from each other and stacked on the first region in a first direction and extending by different lengths in a second direction on the second region, each of the gate electrodes including a gate pad region on the second region and having an exposed upper surface; and a gate contact plug that extends through the gate pad region of at least one of the gate electrodes and into the landing pad in the first direction. The landing pad may include a pad portion that is surrounded by an internal side surface of the substrate insulating layer, and a via portion that extends from the pad portion to the lower interconnection structure of the first semiconductor structure.

According to some example embodiments, a semiconductor device includes: a first semiconductor structure including a first substrate, circuit devices on the first substrate, and a lower interconnection structure connected to the circuit devices; and a second semiconductor structure on the first semiconductor structure. The second semiconductor structure may include: a second substrate having a first region and a second region; an inner substrate insulating layer having a ring shape and extending through the second substrate; gate electrodes spaced apart from each other and stacked on the first region in a first direction and extending with different lengths in a second direction, each of the gate electrodes including a gate pad region having an exposed upper surface on the second region; and a gate contact plug extending in the first direction through the gate pad region of each of the gate electrodes through a space within the ring shape of the inner substrate insulating layer.

According to some example embodiments, a semiconductor device includes: a first semiconductor structure including a first substrate, circuit devices on the first substrate, and a lower interconnection structure connected to the circuit devices; and a second semiconductor structure on the first semiconductor structure. The second semiconductor structure may include: a second substrate having a first region and a second region; gate electrodes spaced apart from each other and stacked on the first region and extending on the second region in a section direction by different lengths, each of the gate electrodes including a gate pad region on the second region having an exposed upper surface; a channel structure extending through the gate electrodes, extending in the first direction, and including a channel layer, on the first region; a gate contact plug extending in the first direction through the gate pad regions of each of the gate electrodes; and a plurality of support structures on the second region, the plurality of support structures extending through the gate electrodes, extending in the first direction, and adjacent to the gate contract plug, on the second region. Upper surfaces of the channel structure, the gate contact plug, and each of the plurality of support structures may be at substantially the same level.

According to an example embodiment, a data storage system includes: a semiconductor storage device including a first semiconductor structure and a second semiconductor structure, the first semiconductor structure including a first substrate, circuit devices on the first substrate, and a lower interconnection structure connected to the circuit devices; and a controller electrically connected to the semiconductor storage device and configured to control the semiconductor storage device. The second semiconductor structure may include: a second substrate having a first region and a second region; an inner substrate insulating layer having a ring shape and penetrating through the second substrate, on a plane; gate electrodes spaced apart from each other and stacked on the first region in a first direction and extending by different lengths in a second direction, each of the gate electrodes including a gate pad region having an upper surface exposed upwardly on the second region; and a gate contact plug extending in the first direction through the gate pad region of at least one of the gate electrodes and through a space within the ring shape of the inner substrate insulating layer.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, some example embodiments will be described with reference to the accompanying drawings.

Figure 1A:
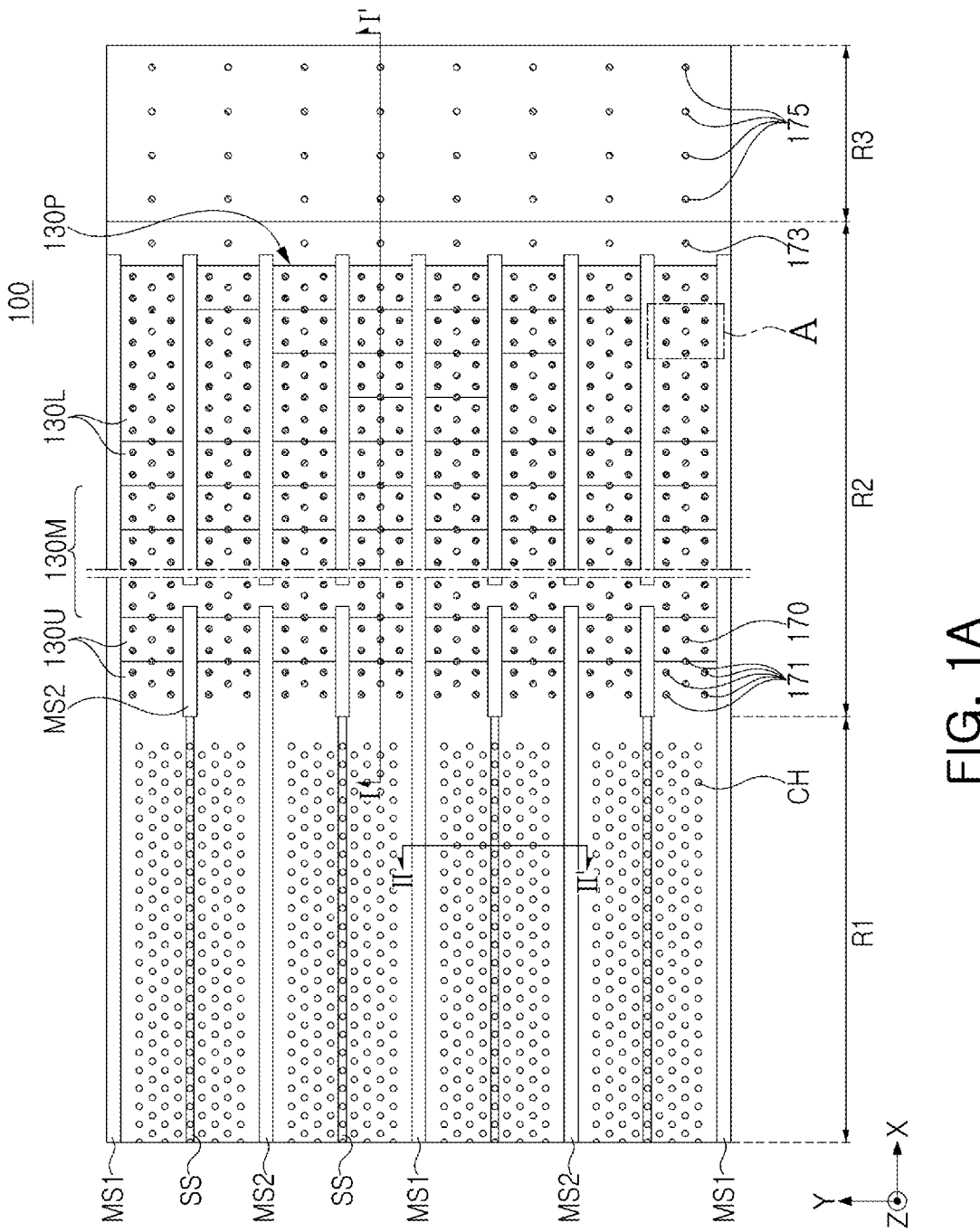
FIG. 1A is a schematic plan view of a semiconductor device according to some example embodiments.

FIG. 1A is a schematic plan view of a semiconductor device 100 according to some example embodiments.

Figure 1B:
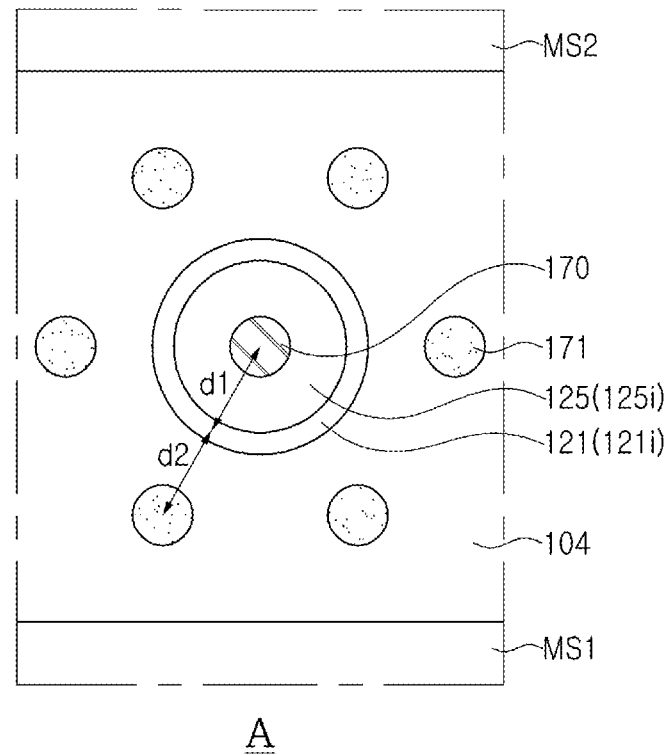
FIG. 1B is a partially enlarged view of a region of a semiconductor device according to some example embodiments.

FIG. 1B is a partially enlarged view of a region of the semiconductor device 100 according to some example embodiments. In particular, FIG. 1B is a partially schematic enlarged view illustrating main elements on a level on which the substrate insulating layer 121 and the gate contact plugs 170 are provided in a region "A" of FIG. 1A.

Figure 2A:
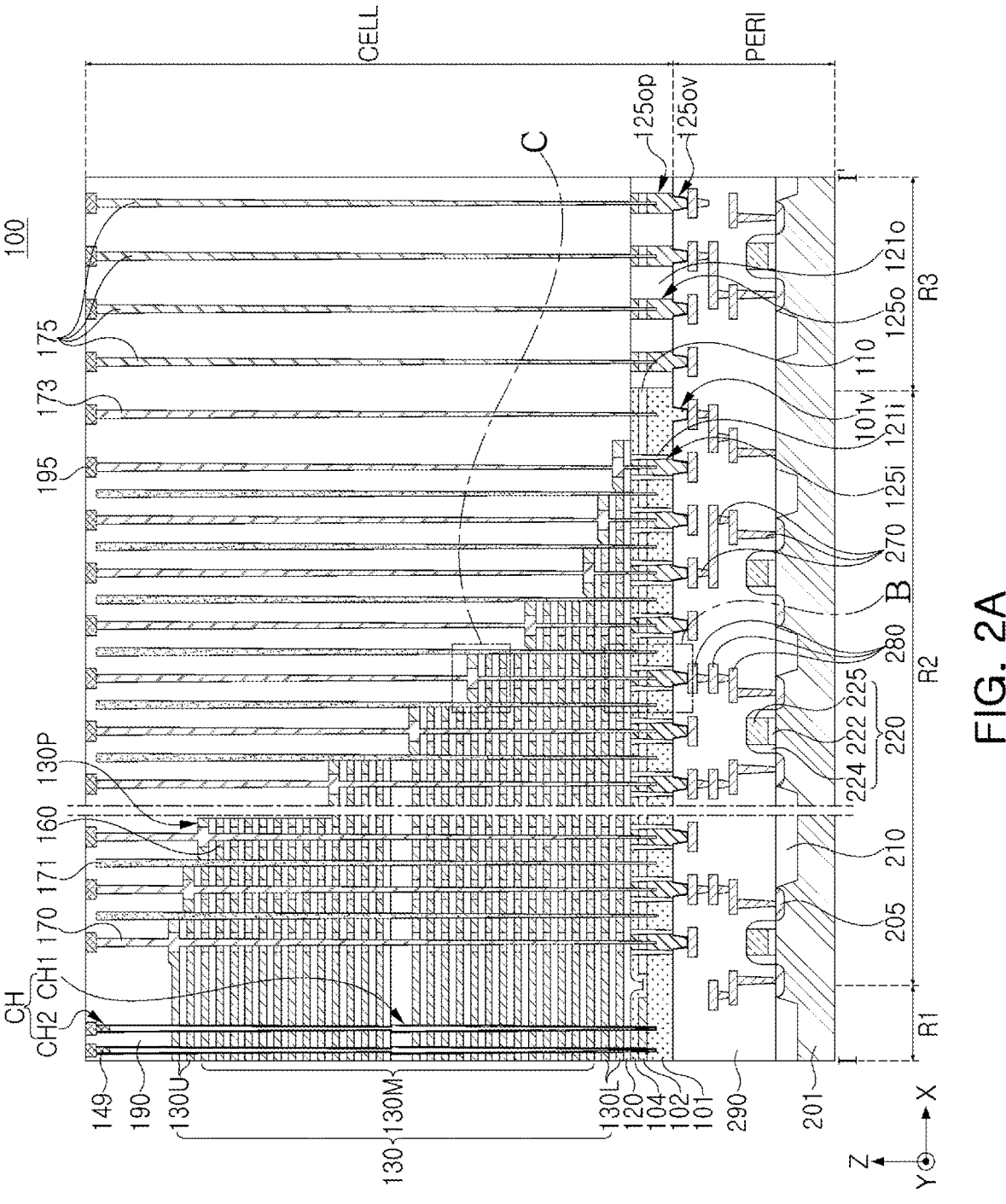
FIGS. 2A and 2B are schematic cross-sectional views of a semiconductor device according to some example embodiments.
Figure 2B:
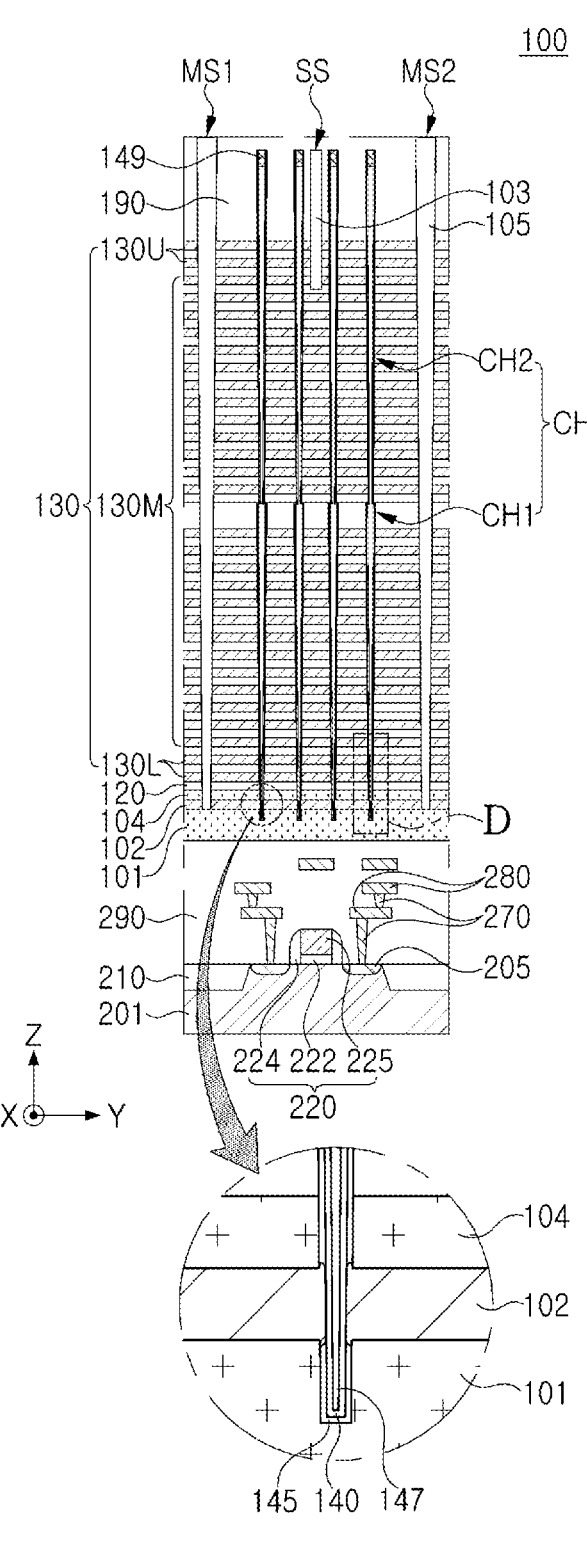

FIGS. 2A and 2B are schematic cross-sectional views of a semiconductor device 100 according to some example embodiments. FIG. 2A illustrates a cross-section taken along line I-I' of FIG. 1A, and FIG. 2B illustrates a cross-section taken along line II-II' of FIG. 1A.

Figure 3A:
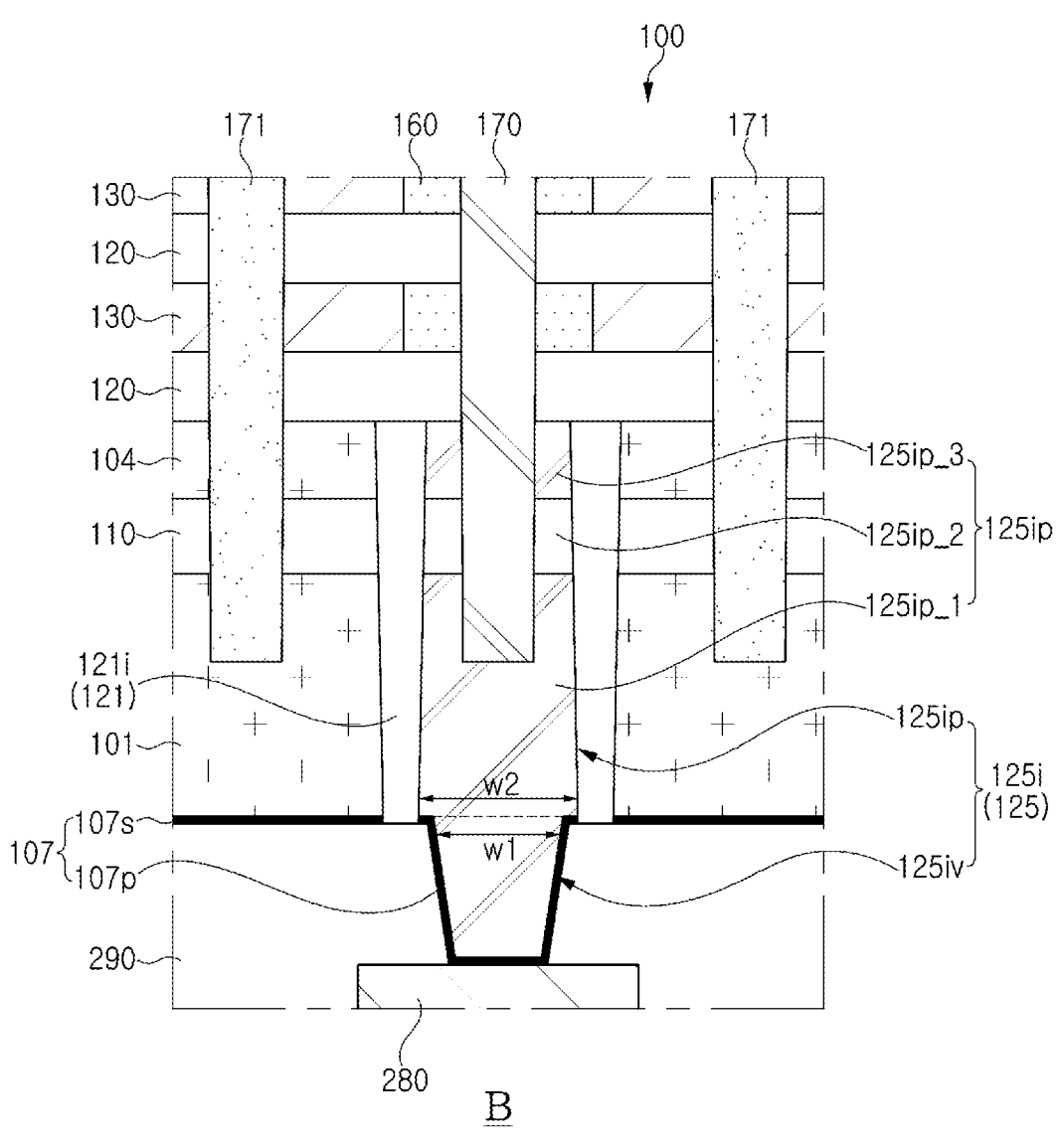
FIGS. 3A and 3B are partially enlarged views of a region of a semiconductor device according to some example embodiments.
Figure 3B:
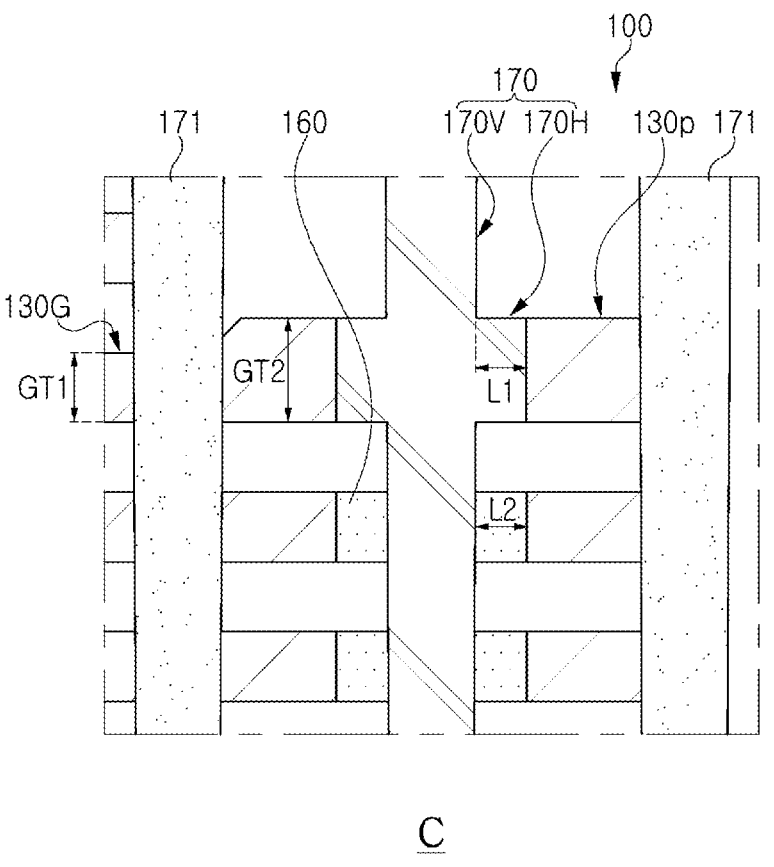

FIGS. 3A and 3B are partially enlarged views illustrating a region of a semiconductor device according to some example embodiments. FIG. 3A is an enlarged view of region "B" of FIG. 2A, and FIG. 3B is an enlarged view of region "C" of FIG. 2A.

Referring to FIGS. 1 to 3B, the semiconductor device 100 may include a peripheral circuit structure PERI, including a first substrate 201, and a memory cell structure CELL including a second substrate 101. The memory cell structure CELL may be on the peripheral circuit structure PERI. In the present specification, the "peripheral circuit structure" may be referred to as a "first semiconductor structure," and the "memory cell structure" may be referred to as a "second semiconductor structure."

The peripheral circuit structure PERI may include a first substrate 201, source/drain regions 205 and isolation layers 210 in the first substrate 201, circuit devices 220 on the first substrate 201, lower interconnection structures 270 and 280, and a peripheral region insulating layer 290.

The first substrate 201 may have an upper surface extending in a first direction, which may be an X-direction (and referred to as such herein), and extending in a second direction, which may be a Y-direction (and referred to as such herein). The first direction and the second direction may intersect or cross each other, and each of the first direction and the second direction may be parallel to an upper surface of the first substrate 201. An active region may be defined in the first substrate 201 by the isolation layers 210. Source/drain regions 205 including impurities may be in a portion of the active region. The first substrate 201 may include a semiconductor material, for example, a group IV semiconductor, a group III-V compound semiconductor, or a group II-VI compound semiconductor. The first substrate 201 may be provided as a bulk wafer or an epitaxial layer.

The circuit devices 220 may include planar transistors. Each of the circuit devices 220 may include a circuit gate dielectric layer 222, a spacer layer 224, and a circuit gate electrode 225. The source/drain regions 205 may be in the first substrate 201 on opposite sides of the circuit gate electrode 225 and adjacent to the circuit gate electrode 225.

The peripheral region insulating layer 290 may be on the first substrate 201 to cover the circuit devices 220. The lower interconnection structures 270 and 280 may include circuit contact plugs 270 and circuit interconnection lines 280. The circuit contact plugs 270 may extend within (and in some cases, may extend through) the peripheral region insulating layer 290 to be connected to the source/drain regions 205. Electrical signals may be applied to the circuit devices 220 by the circuit contact plugs 270. In a region not illustrated, circuit contact plugs 270 may also be connected to the circuit gate electrode 225. The circuit interconnection lines 280 may be connected to the circuit contact plugs 270 and may be provided as a plurality of layers.

The memory cell structure CELL may include a second substrate 101 having a first region R1 and a second region R2, a substrate insulating layer 121 extending through the second substrate 101, a landing pad 125 having at least a portion surrounded by the substrate insulating layer 121, gate electrodes 130 stacked on the second substrate 101, interlayer insulating layers 120 stacked alternately with the gate electrodes 130, channel structures CH extending through a stack structure of the gate electrodes 130 and the interlayer insulating layers 120 and including a channel layer 140, first and second separation regions MS1 and MS2 extending through the stack structure, gate contact plugs 170 extending through the stack structure on the second region R2, and a plurality of support structures 171 extending through the stack structure and adjacent to the gate contact plugs 170.

The memory cell structure CELL may further include a substrate contact plug 173 that is spaced apart from the stack structure and in contact with the second substrate 101, and a through-contact plug 175 that is spaced apart from the stack structure and the second substrate 101 and electrically connected to the lower interconnection structures 270 and 280.

The memory cell structure CELL may further include a first horizontal conductive layer 102 on the first region R1, a horizontal insulating layer 110 provided side by side with the first horizontal conductive layer 102 on the second region R2, a second horizontal conductive layer 104 on the first horizontal conductive layer 102 and the horizontal insulating layer 110, upper separation regions SS extending through a portion of the stack structure of the gate electrodes 130, an insulating structure 160 surrounding the gate contact plugs 170, a cell region insulating layer 190, and cell interconnection lines 195.

The first region R1 of the second substrate 101 may be a region in which the gate electrodes 130 are vertically stacked and the channel structures CH are arranged, and may be a region in which gate electrodes extend by different lengths and may correspond to a region for electrically connecting the memory cells to the peripheral circuit structure PERI. The second region R2 may be on at least one end of the first region R1 in at least one direction, for example, the first or X-direction.

The second substrate 101 may have an upper surface extending in the X-direction and the Y-direction. The second substrate 101 may include a semiconductor material, for example, a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer such as a polycrystalline silicon layer or an epitaxial layer.

In some example embodiments, the semiconductor device 100 may further include a second substrate via 101v and a barrier layer 107. The second substrate via 101v may extend from the second substrate 101 to or into the peripheral circuit structure PERI and may be connected to the lower interconnection structures 270 and 280. The lower interconnection structures 270 and 280 connected to the second substrate via 101v may be ground interconnection structures that may ground the second substrate 101 during a process of fabricating the semiconductor device 100. The second substrate via 101v may be integrated with the second substrate 101. As illustrated in FIG. 2A, the second substrate via 101v may have a shape in which the second substrate 101 extends inwardly into a via hole and toward the first substrate 201. The barrier layer 107 may cover a lower surface of the second substrate 101 between the second substrate 101 and the peripheral circuit structure PERI. The barrier layer 107 may cover side surfaces and a bottom surface of the second substrate via 101v. The barrier layer 107 may include a metal nitride, for example, a titanium nitride (TiN), a titanium silicon nitride (TiSiN), a tungsten nitride (WN), a tantalum nitride (TaN), or combinations thereof.

The first and second horizontal conductive layers 102 and 104 may be sequentially stacked on an upper surface of the first region R1 of the second substrate 101. The first horizontal conductive layer 102 may not extend to the second region R2 of the second substrate 101, while the second horizontal conductive layer 104 may extend to the second region R2.

The first horizontal conductive layer 102 may function as a portion of the common source line of the semiconductor device 100. For example, the first horizontal conductive layer 102 may function as a common source line together with the second substrate 101. As illustrated in the enlarged view of FIG. 2B, the first horizontal conductive layer 102 may be directly connected to the channel layer 140 and a gate dielectric layer 145 (discussed further below) that surrounds the channel layer 140 may be absent at a level at which the first horizontal conductive layer 102 is provided.

The second horizontal conductive layer 104 may be in contact with the second substrate 101 in regions in which the first horizontal conductive layer 102 and the horizontal insulating layer 110 are not provided. In such regions, the second horizontal conductive layer 104 may cover an end portion of the first horizontal conductive layer 102 or the horizontal insulating layer 110 and may be bent to extend on the second substrate 101.

The first and second horizontal conductive layers 102 and 104 may include a semiconductor material. For example, both the first and second horizontal conductive layers 102 and 104 may include polycrystalline silicon. In some example embodiments, at least the first horizontal conductive layer 102 may be or may include a doped layer, and the second horizontal conductive layer 104 may be or may include a doped layer or a layer containing impurities diffused from the first horizontal conductive layer 102. In some example embodiments, the second horizontal conductive layer 104 may be replaced with an insulating layer.

The horizontal insulating layer 110 may be on the second substrate 101 side by side with the first horizontal conductive layer 102 on at least a portion of the second region R2. A lower surface of the horizontal insulating layer 110 may be coplanar with a lower surface of the first horizontal conductive layer 102. The horizontal insulating layer 110 may include first and second horizontal insulating layers, alternately stacked on the second region R2 of the second substrate 101. In some exemplary embodiments, the first horizontal insulating layers may be a plurality of layers covering upper and lower surfaces of the second horizontal insulating layer. The horizontal insulating layer 110 may be or may include layers that remain after a portion of the horizontal insulating layer 110 is replaced with the first horizontal conductive layer 102 in a process of fabricating the semiconductor device 100.

The horizontal insulating layer 110 may include a silicon oxide, a silicon nitride, a silicon carbide, or a silicon oxynitride. The first horizontal insulating layers and the second horizontal insulating layer may include different insulating materials. For example, the first horizontal insulating layers may be formed of the same material as the interlayer insulating layers 120, and the second horizontal insulating layer may be formed of a material that is different from a material of the interlayer insulating layers 120.

As seen in FIG. 3A, the substrate insulating layer 121 may extend through the second horizontal conductive layer 104, the horizontal insulating layer 110, and the second substrate 101. In some example embodiments, an upper surface of the substrate insulating layer 121 may be on substantially the same level as the upper surface of the second horizontal conductive layer 104. In the present specification, two elements described as "substantially the same" may encompass cases in which slight differences or variations occur due to process errors, and the like, even when elements are formed together through the same process. Additionally, even when the term "substantially" is omitted and elements are described as being only "the same," it may be understood similarly and as encompassing such slight differences. In some example embodiments, a lower surface of the substrate insulating layer 121 may be at a level that is lower than a level of a lower surface of the second substrate 101. The substrate insulating layer 121 may include, for example, a silicon oxide, a silicon nitride, a silicon carbide, or a silicon oxynitride. The substrate insulating layer 121 may include an inner substrate insulating layer 121i and an outer substrate insulating layer 121o.

The inner substrate insulating layer 121i may be formed in the second region R2 between the landing pad 125 and the second substrate 101, between the landing pad 125 and the horizontal insulating layer 110, and between the landing pad 125 and the second horizontal conductive layer 104. The inner substrate insulating layer 121i may surround the landing pad 125. The inner substrate insulating layer 121*i* may separate the landing pad 125 from the second substrate 101, the horizontal insulating layer 110, and the second horizontal conductive layer 104. Accordingly, the gate contact plugs 170 connected to the different gate electrodes 130 may be electrically separated from each other.

In some example embodiments, the inner substrate insulating layer 121*i* may have an annular shape. In plan view and as seen in FIG. 1B, the inner substrate insulating layer 121*i* may have a ring shape. In some exemplary embodiments, a width of the inner substrate insulating layer 121*i* may be substantially uniform along the ring shape (e.g., around a circumference or perimeter of the ring shape). The inner substrate insulating layer 121*i* may extend through the second substrate 101 and may have an inner or internal side surface and an outer or external side surface. The inner substrate insulating layer 121*i* may enclose a space within the ring shape or annular shape thereof. The external side surface of the inner substrate insulating layer 121*i* may be in contact with the second substrate 101, and the internal side surface of the inner substrate insulating layer 121*i* may be in contact with the landing pad 125. The inner substrate insulating layer 121*i* may separate the second substrate 101 from the landing pad 125. The inner substrate insulating layer 121*i* may have a width that decreases in a direction toward the first substrate 201.

The outer substrate insulating layer 121*o* may be in a third region R3 which may be provided on an external side of the second substrate 101. The outer substrate insulating layer 121*o* may be surround landing pads 125 in the third region R3. The outer substrate insulating layer 121*o* may separate the landing pad 125 from the second substrate 101, the horizontal insulating layer 110, and the second horizontal conductive layer 104. Accordingly, different through-contact plugs 175 may be electrically separated from each other.

In some example embodiments, the outer substrate insulating layer 121*o* may have a pattern shape or a plate shape through which the landing pads 125 in the region R3 extend.

Referring to FIG. 3A, the substrate insulating layer 121 including the inner substrate insulating layer 121*i* may extend through the barrier layer 107. For example, a lower end of the substrate insulating layer 121 may be on a level that is lower than a level of the lower surface of the second substrate 101. The barrier layer 107 may be divided into a substrate barrier pattern 107*s* and a landing pad barrier pattern 107*p* by the substrate insulating layer 121. The substrate barrier pattern 107*s* may cover a lower surface of the second substrate 101, and the landing pad barrier pattern 107*p* may cover side surfaces and bottom surfaces of via portions 125*iv* and 125*ov* of the landing pads 125.

The landing pad 125 may extend through the substrate insulating layer 121. In some example embodiments, an upper surface of the landing pad 125 may be at substantially the same level as an upper surface of the substrate insulating layer 121. The landing pad 125 be in contact with the gate contact plugs 170 or the through-contact plug 175, and may electrically connect the gate contact plugs 170 or the through-contact plug 175 to the lower interconnection structures 270 and 280. The landing pad 125 may include tungsten (W), copper (CU), aluminum (Al), molybdenum (Mo), or alloys thereof. The landing pads 125 may include an inner landing pad 125*i* and an outer landing pad 125*o*.

The inner landing pad 125*i* may be in the second region R2, and may be surrounded by the inner substrate insulating layer 121*i*. The inner landing pad 125*i* may electrically connect a respective one of the gate contact plugs 170 and the lower interconnection structures 270 and 280.

The inner landing pad 125*i* may include a pad portion 125*ip*, which may be surrounded by the internal side surface of the inner substrate insulating layer 121*i*, and a via portion 125*iv* that extends from the pad portion 125*ip* to the lower interconnection structures 270 and 280. The pad portion 125*ip* may be on a level that is the same as or higher than the level of the lower surface of the second substrate 101. In some example embodiments, the pad portion 125*ip* of the inner landing pad 125*i* may include a first pad portion 125*ip*_1 provided side by side or coplanar with the second substrate 101, a second pad portion 125*ip*_2 provided side by side or coplanar with the horizontal insulating layer 110, and a third pad portion 125*ip*_3 provided side by side or coplanar with the horizontal conductive layer 104. The first to third pad portions 125*ip*_1, 125*ip*_2, and 125*ip*_3 may be respectively spaced apart from the second substrate 101, the horizontal insulating layer 110, and the second horizontal conductive layer 104 by the inner substrate insulating layer 121*i*. The second and third pad portions 125*ip*_2 and 125*ip*_3 may be dummy pad regions. The second pad portion 125*ip*_2 may include the same material as the horizontal insulating layer 110. The first and third pad portions 125*ip*_1 and 125_*ip*3 may include a metal material, for example, tungsten (W). The via portion 125*iv* of the inner landing pad 125*i* may be on a level that is lower than the level of the lower surface of the second substrate 101, and the pad portion 125*ip* of the inner landing pad 125*i* may be on a level that is higher than the level of the lower surface of the second substrate 101. The via portion 125*iv* of the inner landing pad 125*i* may be integrally connected to the pad portion 125*ip* and may extend on a level that is lower than the level the lower surface of the second substrate 101.

The pad portion 125*ip* of the inner landing pad 125*i* may have a width that increases in a direction toward the first substrate 201. This may be because the pad portion 125*ip* of the inner landing pad 125*i* is a region surrounded by the internal side surface of the inner substrate insulating layer 121*i* and in contact with the inner substrate insulating layer 121*i*. The via portion 125*iv* of the inner landing pad 125*i* may have a width that decreases in a direction toward the first substrate 201. This may be because the via portion 125*iv* of the inner landing pad 125*i* is formed in a via hole penetrating through the peripheral circuit insulating layer 290. Accordingly, the inner landing pad 125*i* may include a pad portion 125*ip* that has a side surface having a first slope, and a via portion 125*iv* that has a side surface having a second slope that is different from the first slope.

In the first horizontal direction (for example, the X-direction), a first width w1 of the via portion 125*iv* of the inner landing pad 125*i* may be narrower than a second width w2 of the pad portion 125*ip*. The first width w1 and the second width w2 may each be an equal distance from a level at which the via portion 125*iv* and the pad portion 125*ip* are integrally connected.

The via portion 125*iv* of the inner landing pad 125*i* may have a structure in which a conductive material is in a via hole formed at the same time as a via hole for forming the second substrate via 101*v* in the process of fabricating the semiconductor device 100.

The outer landing pad 125*o* may be in the third region R3 and may be surrounded by the outer substrate insulating layer 121*o*. The outer landing pad 125*o* may electrically connect a respective through-contact plug 175 and the lower interconnection structures 270 and 280 to each other.

The outer landing pad 125*o* may include a pad portion 125*op* that is surrounded by the outer substrate insulating layer 121*o*, and a via portion 125*ov* that extends from the pad portion to the lower interconnection structures 270 and 280. As described for the inner landing pad 125*i*, the outer landing pad 125*o* may include a first pad portion provided side by side or coplanar with the second substrate 101, a second pad portion provided side by side or coplanar with the horizontal insulating layer 110, and a third pad portion provided side by side or coplanar with the second horizontal conductive layer 104. The first to third pad portions may be respectively spaced apart from the second substrate 101, the horizontal insulating layer 110, and the second horizontal conductive layer 104 by the outer substrate insulating layer 121*o*. The second and third pad portions may be a dummy pad region. The second pad portion may include the same material as the horizontal insulating layer 110. The first and third pad portions may include a metal material, for example, tungsten (W). The via portion 125*ov* of the outer landing pad 125*o* may be on a level that is lower than the level of the lower surface of the second substrate 101. The via portion 125*ov* of the outer landing pad 125*o* may be integrally connected with the pad portion 125*op* and may extend on a level that is lower than the level of the lower surface of the second substrate 101.

The outer landing pad 125*o* may include a pad portion 125*op* having a side surface that has a first slope similar to the slope described for the inner landing pad 125*i*, and a via portion 125*ov* may have a side surface having a second slope that is different from the first slope.

The via portion 125*ov* of the outer landing pad 125*o* may have a structure in which a conductive material is in a via hole formed at the same time as a via hole for forming the second substrate via 101*v* in the process of fabricating the semiconductor device 100.

The gate electrodes 130 may be vertically spaced apart from each other and stacked on the second substrate 101 to constitute a stack structure. The gate electrodes 130 may include lower gate electrodes 130L constituting gates of ground select transistors, memory gate electrodes 130M constituting a plurality of memory cells, and upper gate electrodes 130U constituting gates of string select transistors. The number of memory gate electrodes 130M, constituting memory cells, may be determined depending on capacity of the semiconductor device 100. According to some example embodiments, each of the number of upper gate electrodes 130U and the number of lower gate electrodes 130L may be 1 to 4 or more, and the upper and lower gate electrodes 130U and 130L may have a structure, the same as or similar to a structure of the memory gate electrodes 130M. In some example embodiments, the gate electrodes 130 may further include gate electrodes provided above the upper gate electrodes 130U (or farther from the second substrate 101) and/or below the lower gate electrode of the upper gate electrodes 130U and constituting an erase transistor used in an erase operation using a gate induced leakage current (GIDL) phenomenon. Also, a portion of the gate electrodes 130, for example, the memory gate electrodes 130M adjacent to the upper or lower gate electrodes 130U and 130L, may be dummy gate electrodes.

The gate electrodes 130 may be vertically stacked and spaced apart from each other on the first region R1, and may extend from the first region R1 to the second region R2 by different lengths to form a stepped structure having a staircase shape. As illustrated in FIG. 2A, the gate electrodes 130 may form a stepped structure between the gate electrodes 130 in the X direction and may also have a stepped structure in the Y direction.

Due to the stepped structure, the gate electrodes 130 may have regions in which a lower gate electrode 130 extends farther than an upper gate electrode 130 and is exposed upwardly from the interlayer insulating layers 120. The regions may be referred to as gate pad regions 130P. For each gate electrode 130, the gate pad region 130P may be a region that includes an end portion in the X-direction of the gate electrode 130. The gate pad region 130P may correspond to a portion of an uppermost gate electrode 130 in each of the regions, among the gate electrodes 130 constituting the stack structure. The gate electrodes 130 may be connected to gate contact plugs 170 in the gate pad regions 130P. Regions other than the gate pad region 130P of each of the gate electrodes 130 may be referred to as a gate stack region 130G. The gate stack region 130G may be a portion which is not exposed upwardly from the interlayer insulating layers 120.

Each of the gate electrodes 130 may have an increased thickness in the gate pad regions 130P. The thickness of each of the gate electrodes 130 may be increased in such a manner that a level of an upper surface is increased while a level of a lower surface is constant. As illustrated in FIG. 3B, the gate stack region 130G of the gate electrodes 130 may extend from the first region R1 toward the second region R2 by a first gate thickness GT1, and may have a second gate thickness GT2 greater than a first gate thickness GT1 in at least a portion of the gate pad regions 130P. The second gate thickness GT2 may range from about 150% to about 210% of the first gate thickness GT1.

The gate electrodes 130 may be separated from each other in the Y-direction by the first separation regions MS1 extending in the X-direction. Gate electrodes 130 between a pair of first separation regions MS1 may constitute a single memory block, but the scope of the memory block is not limited thereto. The gate electrodes 130 may include a metal material, for example, tungsten (W). In example embodiments, the gate electrodes 130 may include polycrystalline silicon or a metal silicide material.

The interlayer insulating layers 120 may be between the gate electrodes 130. Similarly to the gate electrodes 130, the interlayer insulating layers 120 may be spaced apart from each other in a direction that is perpendicular to an upper surface of the second substrate 101 (e.g., a third direction or a Z-direction). The interlayer insulating layers 120 may extend in the X-direction. The interlayer insulating layers 120 may include an insulating material such as a silicon oxide or a silicon nitride.

The gate electrodes 130 and the interlayer insulating layers 120 may constitute a stack structure. In an example embodiment, the stack structure may have a two-stage structure as illustrated in FIG. 2A, but example embodiments are not limited thereto. According to example embodiment, the stack structure may have a multistage structure having three or more stages, or the stack structure may be a single-stage structure.

The first and second separation regions MS1 and MS2 may extend in the X-direction through the gate electrodes 130. The first and second separation regions MS1 and MS2 may be parallel to each other. The first and second separation regions MS1 and MS2 may extend through the entire gate electrodes 130 that are stacked on the second substrate 101, and the first and second separation regions MS1 and MS2 may contact the second substrate 101. The first separation regions MS1 may extend as a single region in the X-direction, and the second separation regions MS2 may intermittently extend between the pair of first separation regions MS1 or may be only in some regions. However, in example embodiments, the arrangement order and number of the first and second separation regions MS1 and MS2 are not limited to those illustrated in FIG. 1A. As illustrated in FIG. 2B, a separation insulating layer 105 may be in the first and second separation regions MS1 and MS2.

As illustrated in FIG. 1A, the upper separation regions SS may extend in the X-direction between the first separation regions MS1 and the second separation regions MS2 on the first region R1. As illustrated in FIG. 2B, the upper separation regions SS may separate a total of three gate electrodes 130 including the upper gate electrodes 130U from each other in the Y-direction. However, the number of gate electrodes 130 separated by the upper separation regions SS may vary according to some example embodiments. The upper gate electrodes 130U separated by the upper separation regions SS may constitute different string select lines. An upper separation insulating layer 103 may be in the upper separation regions SS. The upper separation insulating layer 103 may include an insulating material, for example, a silicon oxide, a silicon nitride, or a silicon oxynitride.

As illustrated in FIG. 1A, the channel structures CH may each constitute a single memory cell string, and may be spaced apart from each other while forming rows and columns on the first region R1. The channel structures CH may form a grid pattern or may be in a zigzag pattern in one direction. The channel structures CH may have a columnar shape, and may have inclined side surfaces narrowed in a direction toward the second substrate 101, depending on an aspect ratio.

An upper surface of the channel structures CH may be on substantially the same level as an upper surface of each of the gate contact plugs 170 or an upper surface of the through-contact plug 175. This may be because holes for forming the gate contact plugs 170 and the through-contact plug 175 may be formed together in an etching process of forming holes for forming the channel structures CH. The holes corresponding to the channel structures CH and the holes corresponding to the gate contact plugs 170 may be simultaneously formed, so that a semiconductor device having improved productivity or characteristics may be provided.

In some example embodiments, each of the channel structures CH may include first and second channel structures CH1 and CH2 vertically stacked as illustrated in FIG. 2A. In this case, each of the channel structures CH may have a form in which the first channel structure CH1 and the second channel structure CH2 are connected to each other, and may have a bent portion formed due to a difference in width in the connection region. However, the number of channel structures stacked in a Z-direction may vary depending on the number of stages of the stack structure.

As illustrated in the enlarged view of FIG. 2B, the channel layer 140 may be in the channel structures CH. In the channel structures CH, the channel layer 140 may be formed to have an annular shape surrounding a channel filling insulating layer 147 therein. The channel layer 140 may be connected to the first horizontal conductive layer 102, as discussed previously. The channel layer 140 may include a semiconductor material such as polycrystalline silicon or single-crystalline silicon.

A gate dielectric layer 145 may be between the gate electrodes 130 and the channel layer 140. Although not illustrated in detail, the gate dielectric layer 145 may include a tunneling layer, a charge storage layer, and a blocking layer stacked sequentially from the channel layer 140. The tunneling layer may tunnel charges into a charge storage layer and may include, for example, a silicon oxide ($SiO_2$), a silicon nitride ($Si_3N_4$), a silicon oxynitride (SiON), or combinations thereof. The charge storage layer may be a charge trap layer or a floating gate conductive layer. The blocking layer may include a silicon oxide ($SiO_2$), a silicon nitride ($Si_3N_4$), a silicon oxynitride (SiON), a high-κdielectric material, or combinations thereof. In some example embodiments, at least a portion of the gate dielectric layer 145 may extend in a horizontal direction along the gate electrodes 130. The channel pad 149 may be on only an upper end of the upper second channel structure CH2, but example embodiments are not limited thereto. The channel pad 149 may include, for example, doped polycrystalline silicon.

The gate contact plugs 170 may extend through an uppermost gate electrode 130 and an insulating structure 160 on the second region R2, and may be connected to gate pad regions 130P of the gate electrodes 130. The gate contact plugs 170 may extend through at least a portion of the cell region insulating layer 190 and may be connected to respective ones of the gate pad regions 130P of the gate electrodes 130 that are upwardly exposed.

As illustrated in FIG. 3B, each of the gate contact plugs 170 may include a vertical extension portion 170V, extending in the Z-direction, and a horizontal extension portion 170H extending horizontally from the vertical extension portion 170V and in contact with the pad regions 130P. The vertical extension portion 170V may have a cylindrical shape of which a width is decreased in a direction toward the second substrate 101 due to an aspect ratio. The horizontal extension portion 170H may be along a periphery of the vertical extension portion 170V, and may extend from a side surface of the vertical extension portion 170V to the other end portion by a first length L1. The first length L1 may be smaller than a second length L2 of the lower insulating structure 160.

The insulating structure 160 may surround the gate contact plugs 170 while being provided alternately with the interlayer insulating layers 120. The insulating structure 160 may surround side surfaces of the gate contact plugs 170 below the pad regions 130P. An internal side surface of the insulating structure 160 may surround the gate contact plugs 170, and an external side surface of the insulating structure 160 may be surrounded by the gate electrodes 130. The gate contact plugs 170 may be physically and electrically connected to a single gate electrode 130, and may be electrically separated from underlying gate electrodes 130 by the insulating structure 160. The insulating structure 160 may include an insulating material, for example, at least one of a silicon oxide, a silicon nitride, and a silicon oxynitride.

Each of the gate contact plugs 170 may extend in the Z-direction through the gate pad region 130P to contact the landing pad 125. In some example embodiments, each of the gate contact plugs 170 may extend inwardly of the inner landing pad 125i to contact the inner landing pad 125i. The gate contact plugs 170 may be electrically connected to the lower interconnection structures 270 and 280 through the inner landing pad 125i. The gate contact plugs 170 may extend in the Z-direction through a space within the ring-shaped internal surface of the inner substrate insulating layer 121i. The gate contact plugs 170 may be electrically separated from the second substrate 101 and the second horizontal conductive layer 104 by the inner substrate insulating layer 121i surrounding the inner landing pad 125i. In an example embodiment, the gate contact plugs 170 may be integrally connected to at least a portion of the inner landing pad 125i, for example, the via portion 125iv, the first pad portion 125ip_1, and the third pad portion 125ip_3. In this case, interfaces between the gate contact plugs 170 and the landing pad portions may be distinct, but example embodiments are not limited thereto.

A lower end of each of the gate contact plugs 170 may be on a level that is higher than a level of a lower surface of the second substrate 101. The lower end of each of the gate contact plugs 170 may be on a level that is higher than a level of the via portion 125*iv* of the inner landing pad 125*i* while contacting the pad portion 125*ip* of the inner landing pad 125*i*. In some example embodiments, a lower surface of each of the gate contact plugs 170 may be on a level that is substantially the same level as a lower surface of each of the plurality of support structures 171, a lower surface of each of the channel structures CH, or a lower surface of the through-contact plug 175. For example, a lower end of each of the channel structures CH, the gate contact plugs 170, the plurality of support structures 171, and the through-contact plug 175 may be on a level that is higher than a level of the lower surface of the second substrate 101. In some example embodiments, an upper surface of each of the gate contact plugs 170 may be on a level that is substantially the same as a level of an upper surface of each of the plurality of support structures 171, an upper surface of each of the channel structures CH, or an upper surface of the through-contact plug 175.

In an etching process of forming openings corresponding to the plurality of support structures 171 or the channel structures CH, openings for forming the gate contact plugs 170 may be formed together. Since the inner landing pad 125*i* having the pad portion 125*ip* on a level that is parallel to the second substrate 101 is included, lower surfaces of the openings corresponding to the gate contact plugs 170 may be adjusted to be on a level that is higher than a level of the lower surface of the pad portion 125*ip*. Accordingly, a height of a lower end of each of the openings corresponding to the plurality of support structures 171 and the gate contact plugs 170 may match a level of the second substrate 101. Thus, the openings may be simultaneously formed, so that a semiconductor device having improved productivity such as reduced process difficulty may be provided.

In addition, by performing an etching process such that the lower surface of each of the gate contact plugs 170 is on a level that is higher than the level of the lower surface of the second substrate 101, a misalignment issue or an etching depth issue in the etching process may be addressed. For example, one process defect issue that may be addressed may arise when openings corresponding to the gate contact plugs 170 that extend through a barrier layer 107 that covers a side surface or a bottom surface of the via portion 125*iv*.

Since the gate contact plugs 170 and the inner landing pad 125*i* are spaced apart from the second substrate 101 or the barrier layer 107 by the inner substrate insulating layer 121*i*, the gate contact plugs 170 and the inner landing pad 125*i* may be electrically separated from the second substrate 101 or the barrier layer 107. Accordingly, a semiconductor device having improved electrical properties as well as improved productivity may be provided.

The gate contact plugs 170 may include at least one of, for example, tungsten (W), copper (Cu), aluminum (Al), and alloys thereof.

The plurality of support structures 171 may be spaced apart from each other while forming rows and columns on the second region R2. The plurality of support structures 171 may be also provided on a portion of the first region R1 adjacent to the second region R2. The plurality of support structures 171 may not be electrically connected to overlying interconnection structures. The plurality of support structures 171 may be filled with an insulating material such as an oxide, but may include the same structure and material as the channel structures CH.

The plurality of support structures 171 may extend in the Z-direction while penetrating through the gate electrodes 130, and may be adjacent to each of the gate contact plugs 170. Referring to FIGS. 1A and 1B, an arrangement relationship of the plurality of support structures 171 is illustrated as six support structures 171 surrounding a single gate contact plug 170 in a hexagonal structure. Alternatively, the arrangement relationship of the plurality of support structures 171 may have various modifications, such as an arrangement of four support structures surrounding a single gate contact plug 170 in a rectangular structure. Other example embodiments may have other arrangements of the support structures 171.

The plurality of support structures 171 may have a columnar shape, and may have inclined side surfaces that narrow in a direction toward the second substrate 101 depending on an aspect ratio. In example embodiments, the plurality of support structures 171 may further have horizontal extension portions on a level that is even with or coplanar with the gate electrodes 130. The plurality of support structures 171 may penetrate through the second horizontal conductive layer 104 and the horizontal insulating layer 110, and may extend into of the second substrate 101. In some example embodiments, an upper surface of each of the plurality of support structures 171 may be on substantially the same level as (or coplanar with) an upper surface of each of the channel structures CH or an upper surface of each of the gate contact plugs 170.

In some example embodiments, a lower surface of each of the plurality of support structures 171 may be on substantially the same level as a lower surface of each of the gate contact plugs 170. Referring to FIGS. 1B and 2A, the inner substrate insulating layer 121*i* may surround at least a portion of each of the gate contact plugs 170 between the plurality of support structures 171 and each of the gate contact plugs 170. As illustrated in FIG. 1B, a first distance d1 from each of the gate contact plugs 170 to the inner substrate insulating layer 121*i* may be substantially the same as a second distance d2 from each of the plurality of support structures 171 adjacent to each of the gate contact plugs 170 to the inner substrate insulating layer 121*i*. In some example embodiments, the first distance d1 and the second distance d2 may be different from each other.

The through-contact plug 175 may be in the third region R3 and/or an external region of the second substrate 101, and may extend to the peripheral circuit structure PERI through the cell region insulating layer 190. The through-contact plug 175 may connect the cell interconnection lines 195 of the memory cell structure CELL to the circuit interconnection lines 280 of the peripheral circuit structure PERI. The through-contact plug 175 may be spaced apart from the gate electrodes 130, and may extend into the outer landing pad 125*o* in the Z-direction. Accordingly, the through-contact plug 175 may be electrically connected to the lower interconnection structures 270 and 280 through the outer landing pad 125*o*. The through-contact plug 175 may include a conductive material, for example, a metal material such as tungsten (W), copper (Cu), or aluminum (Al). The through-contact plugs 175 may be formed in the same process as the gate contact plugs 170, and may include the same material as the gate contact plugs 170.

A lower end of the through-contact plug 175 may be on a level that is higher than the level of the lower surface of the second substrate 101. The lower end of the through-contact plug 175 may be on a level that is higher than a level of the via portion 125*ov* of the outer landing pad 125*o* while contacting the pad portion 125*op* of the outer landing pad 125*o*. In some example embodiments, the lower surface of the through-contact plug 175 may be on substantially the same level as a lower surface of each of the plurality of support structures 171 or a lower surface of each of the channel structures CH.

The substrate contact plug 173 may be spaced apart from the gate electrodes 130 on the second region R2, and may extend in the Z-direction while extending through the cell region insulating layer 190 and extending into of the second substrate 101. The substrate contact plug 173 may contact the second substrate 101 and may be electrically connected to the second substrate 101. A lower end of the substrate contact plug 173 may be on substantially the same level as a lower end of each of the gate contact plugs 170. The substrate contact plug 173 may include a conductive material, for example, tungsten (W), aluminum (Al), or copper (Cu).

The cell region insulating layer 190 may cover the second substrate 101 and the gate electrodes 130 on the second substrate 101. The cell region insulating layer 190 may be formed of an insulating material, or may include a plurality of insulating layers.

The interconnection lines 195 may constitute an upper interconnection structure that is electrically connected to memory cells in the memory cell structure CELL. The interconnection lines 195 may be connected to the channel structures CH, the gate contact plugs 170, and the through plugs 175. The number of contact plugs and interconnection lines constituting the upper interconnection structure may vary according to example embodiments. In some example embodiments, the channel structures CH and the gate contact plugs 170 may be connected to interconnection lines 195 having different levels. The interconnection lines 195 may include metal, for example, tungsten (W), copper (Cu), aluminum (Al), or the like.

FIGS. 4A to 4D are partially enlarged views of regions of a semiconductor device according to some example embodiments. FIGS. 4A to 4D are schematic partially-enlarged views illustrating main elements corresponding to region "A" of FIG. 1A.

Figure 4A:
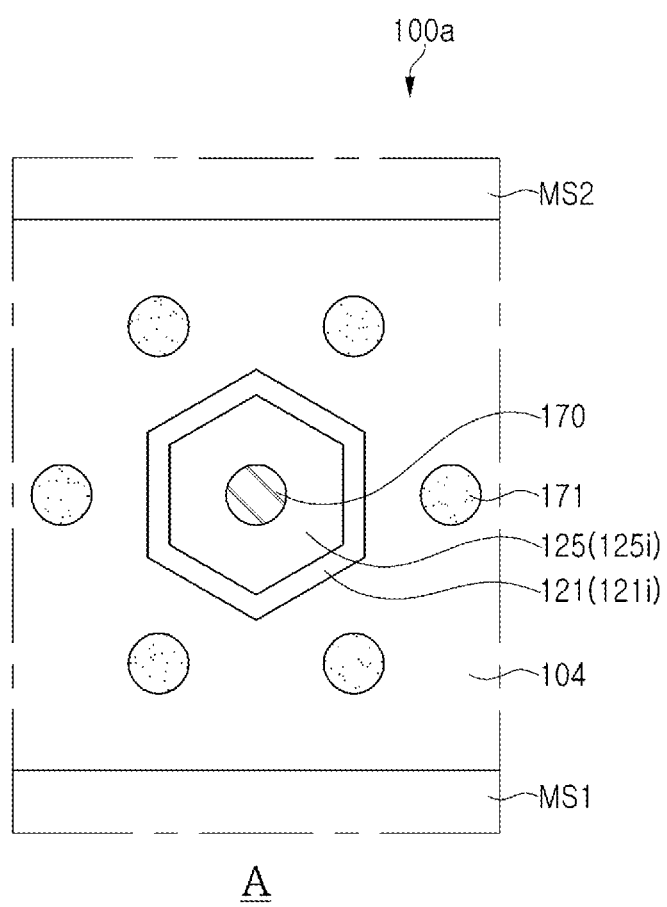
FIGS. 4A, 4B, 4C, and 4D are partially enlarged views of a region of a semiconductor device according to some example embodiments.

Referring to FIG. 4A, a semiconductor device 100*a* according to some example embodiments may have a structure of an inner substrate insulating layer 121*i* that is different from that of FIG. 1A. The inner substrate insulating layer 121*i* may surround an inner landing pad 125*i*, and may separate the inner landing pad 125*i* and a second substrate 101 or the inner landing pad 125*i* and a second horizontal conductive layer 104 from each other.

The inner substrate insulating layer 121*i* may be surround gate contact plugs 170, and may be between the gate contact plugs 170 and a plurality of support structures 171 that are adjacent to the each gate contact plug 170.

In some example embodiments, the inner substrate insulating layer 121*i* may have an annular shape. In plan view, the inner substrate insulating layer 121*i* may have a ring shape. The ring shape may be a polygonal ring structure, for example, a hexagonal ring structure. A distance from the hexagonal ring to the gate contact plug 170 surrounded by the hexagonal ring may be substantially the same as a distance from the hexagonal ring to each of the support structures 171 located adjacent thereto (e.g., the six most proximate support structures 171 to the hexagonal ring). In some embodiments, an edge of the hexagonal ring may rotate or turn by a predetermined angle from a virtual line connecting each of the gate contact plugs 170 and the adjacent support structure 171 to each other. Accordingly, a semiconductor device having secured productivity while securing process margins of the gate contact plugs 170 and the plurality of support structures 171 may be provided.

In some example embodiments, the inner landing pad 125*i* may be along an internal side surface of the inner substrate insulating layer 121*i* and may have a hexagonal structure.

Figure 4B:
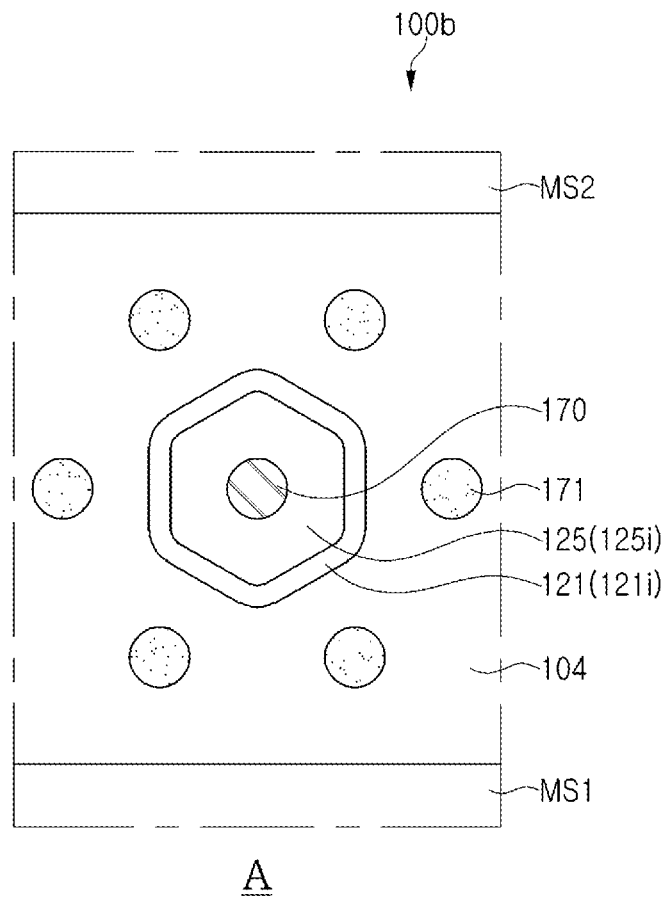

Referring to FIG. 4B, in a semiconductor device 100*b* according to some example embodiments, an inner substrate insulating layer 121*i* may have a corner-rounded polygonal structure, for example, a hexagonal ring structure. The structure may be a structure deformed according to process conditions of an etching process for forming the inner substrate insulating layer 121*i*. The hexagonal ring is illustrated as having rounded corners of both internal and external side surfaces, but example embodiments are not limited thereto.

Figure 4C:
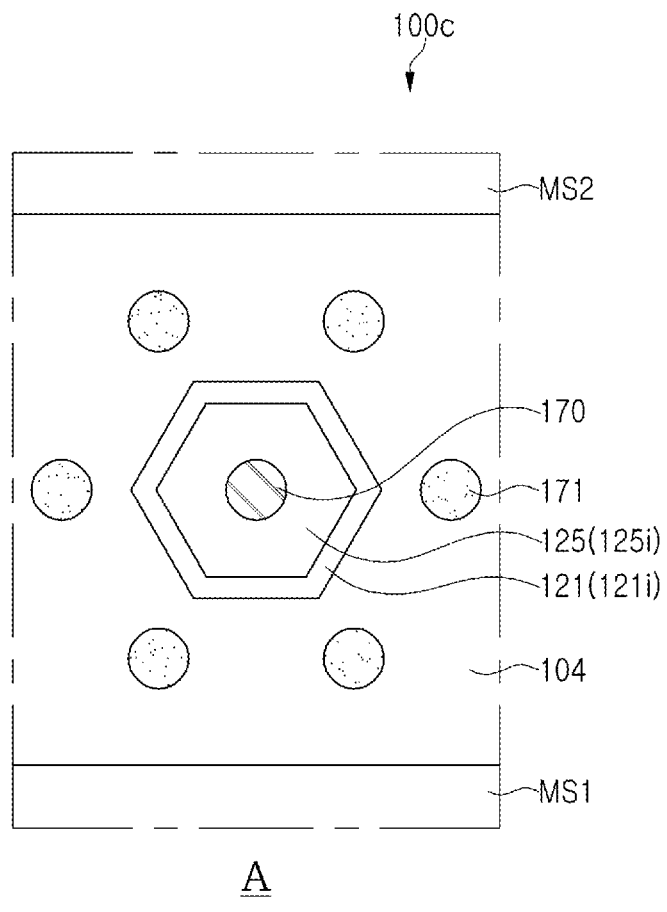

Referring to FIG. 4C, in a semiconductor device 100*c* according to example embodiments, an inner substrate insulating layer 121*i* may have a polygonal ring structure, for example, a hexagonal ring structure, but may have a hexagonal ring structure, different from that of FIG. 4A. Vertices of the hexagonal ring may be on virtual lines between the gate contact plug 170 and the support structures 171 adjacent thereto.

Figure 4D:
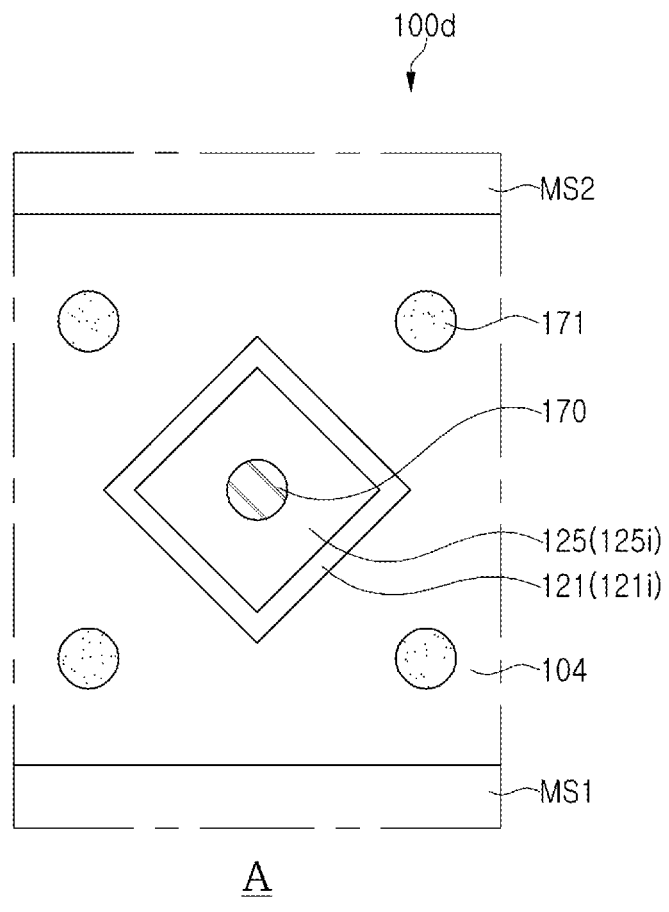

Referring to FIG. 4D, in a semiconductor device 100*d* according to some example embodiments, an inner substrate insulating layer 121*i* may have a polygonal ring structure, for example, a square ring structure. A distance from the square ring to the gate contact plug 170 bounded thereby may be substantially the same as a distance from the square ring to each support structure 171 adjacent thereto. In some embodiments, a corner of the square ring may rotate or turn by a predetermined angle from a virtual line connecting the gate contact plug 170 and the support structures 171 adjacent thereto. In some embodiments, the corner or vertex of the square ring may be on the virtual line.

In some example embodiments, the inner landing pad 125*i* may be provided along an internal side surface of the inner substrate insulating layer 121*i* and may have a rectangular structure.

As illustrated in FIG. 4D, in some embodiments when a single gate contact plug 170 and a plurality of support structures 171 adjacent to each other are arranged to have rectangular structures, an inner substrate insulating layer 121*i* surrounding the gate contact plug 170 between the gate contact plug 170 and the plurality of support structures 171 may have a square ring structure. According to some example embodiments, the inner substrate insulating layer 121*i* may have various ring shapes, irrespective of an arrangement relationship of the plurality of support structures 171.

Figure 5A:
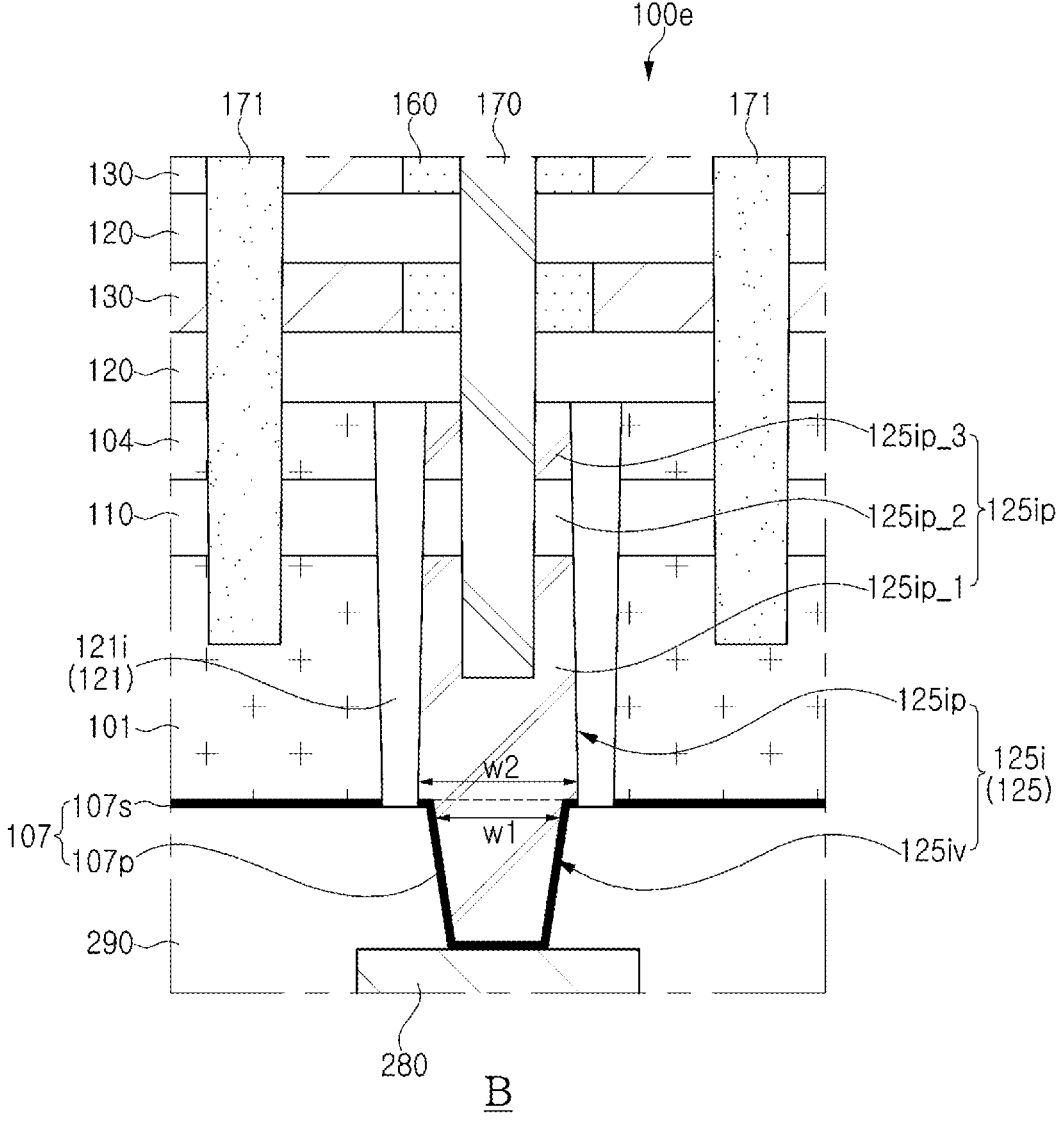
FIGS. 5A and 5B are partially enlarged views of a semiconductor device according to some example embodiments.
Figure 5B:
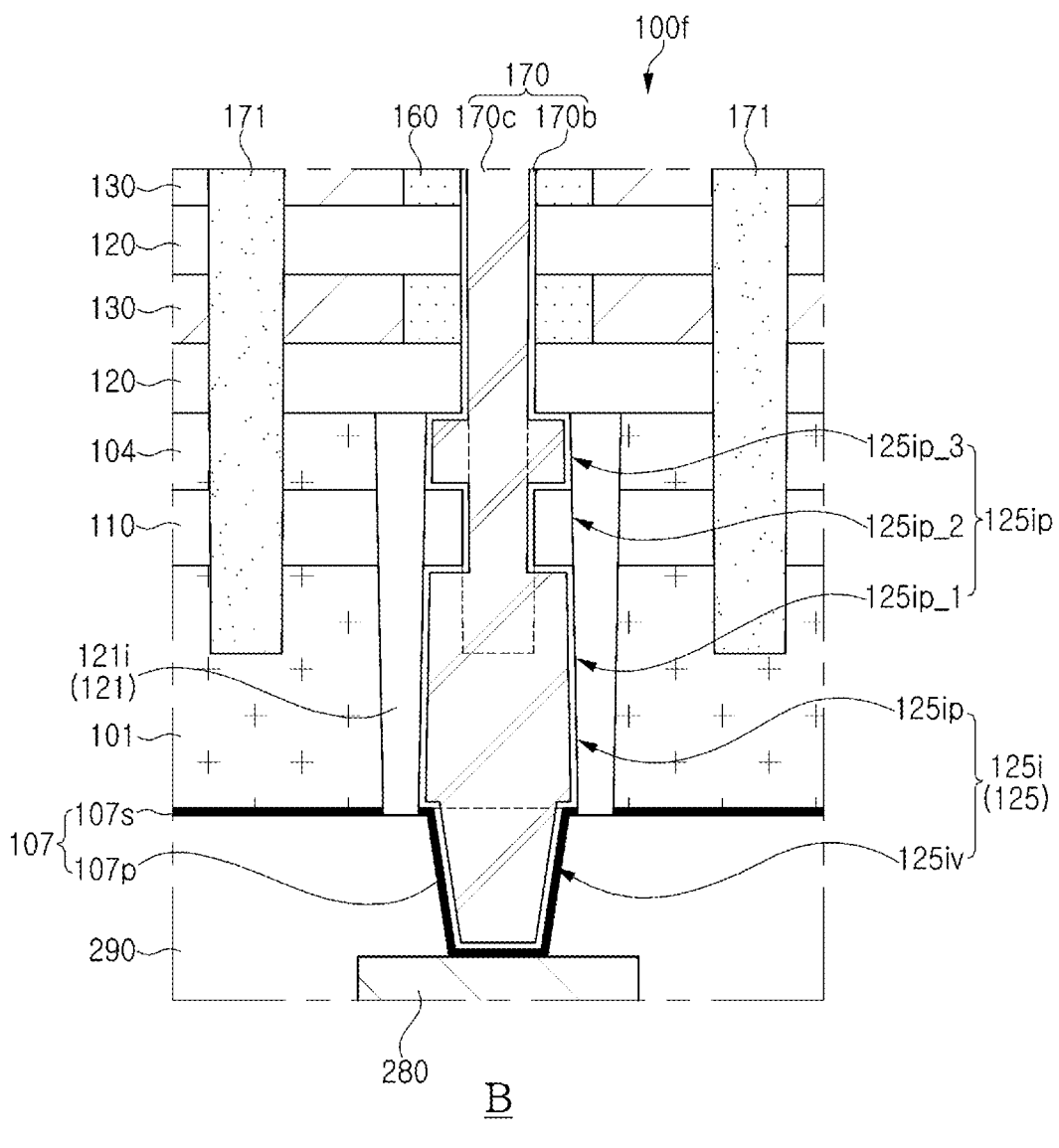

FIGS. 5A and 5B are partially enlarged views of a semiconductor device according to some example embodiments. FIGS. 5A and 5B are partially enlarged views of a region corresponding to region "B" of FIG. 2A.

Referring to FIG. 5A, a semiconductor device 100*e* according to some example embodiments may have a structure of the gate contact plugs 170, different from that of FIG. 3A.

A lower surface of each of the gate contact plugs 170 may be on a level that is different from a level of a lower surface of each of a plurality of adjacent support structures 171.

In some example embodiments, the lower surface of each of the gate contact plugs 170 may be at a level that is lower than a level of the lower surface of each of the plurality of support structures 171. Alternatively, the lower surface of each of the gate contact plugs 170 may be at a level that is higher than a level of the lower surface of each of the plurality of support structures 171. According to some example embodiments, the lower surfaces of the gate contact plugs 170 may be at a level that is lower than a level of a pad portion 125ip, so that lower ends of the gate contact plugs 170 may contact a via portion 125iv. This may be because, although openings corresponding to the plurality of support structures 171 and openings corresponding to the gate contact plugs 170 are formed by the same etching process, the openings may vary depending on a difference in etching rates of upper structures to be etched, process conditions, and the like.

Referring to FIG. 5B, in a semiconductor device 100f according to some example embodiments, each of the gate contact plugs 170 may be integrally connected to at least a portion of the inner landing pad 125i.

Each of the gate contact plugs 170 may be integrally connected to the via portion 125iv, the first pad portion 125ip_1, and the third pad portion 125ip_3 of the inner landing pad 125i. Accordingly, interfaces between the gate contact plugs 170 and the via portion 125iv, the first pad portion 125ip_1, and the third pad portion 125ip_3 may be indistinct.

The gate contact plugs 170 may include a plug layer 170c and a barrier layer 170b that covers side surfaces and a bottom surface of the plug layer 170c.

In some example embodiments, and in contrast to the example shown in FIG. 5B, the gate contact plugs 170 may have a multilayer structure including a plug layer and a barrier layer.

Figure 6A:
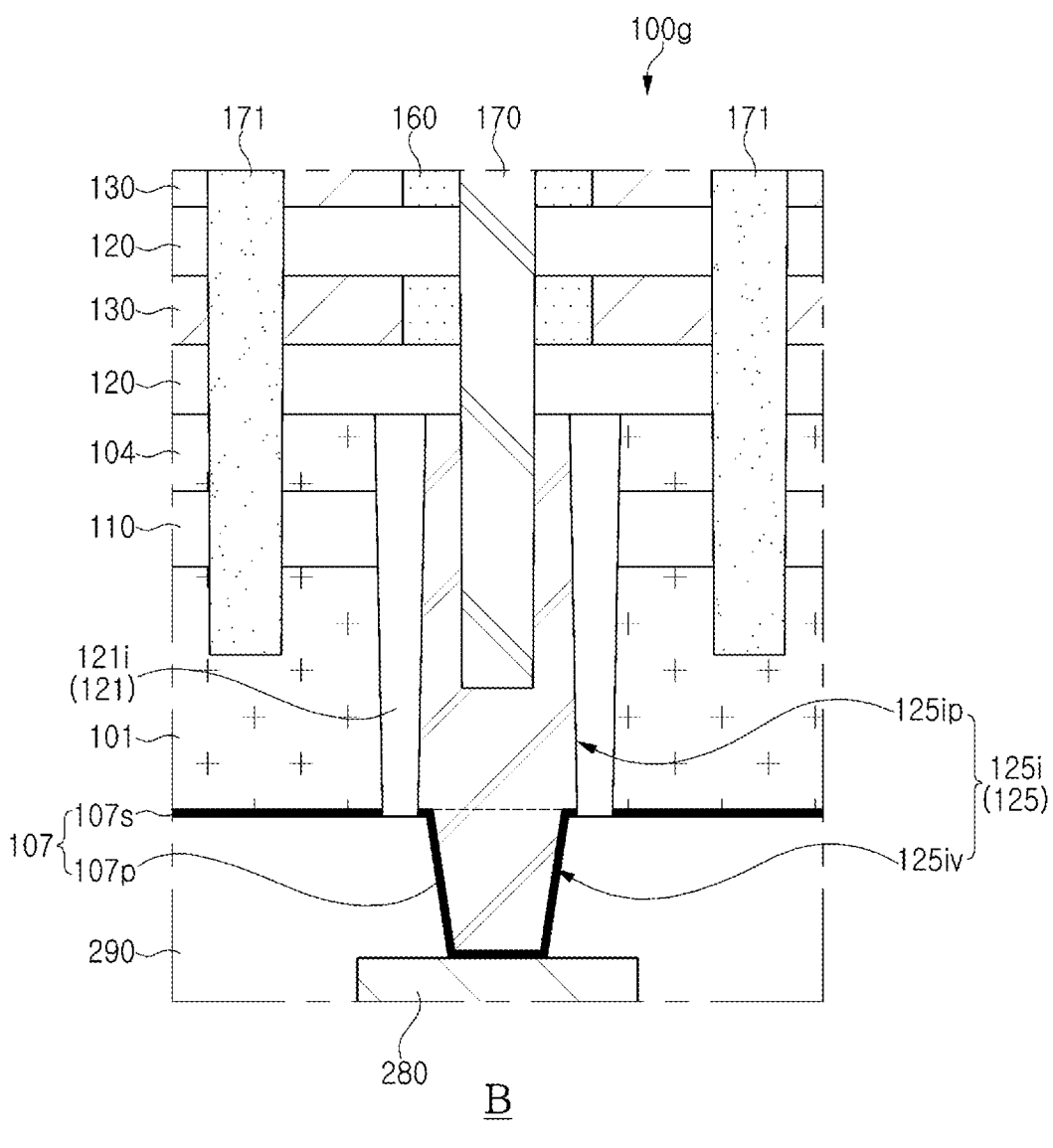
FIGS. 6A and 6B are partially enlarged views of a semiconductor device according to some example embodiments.
Figure 6B:
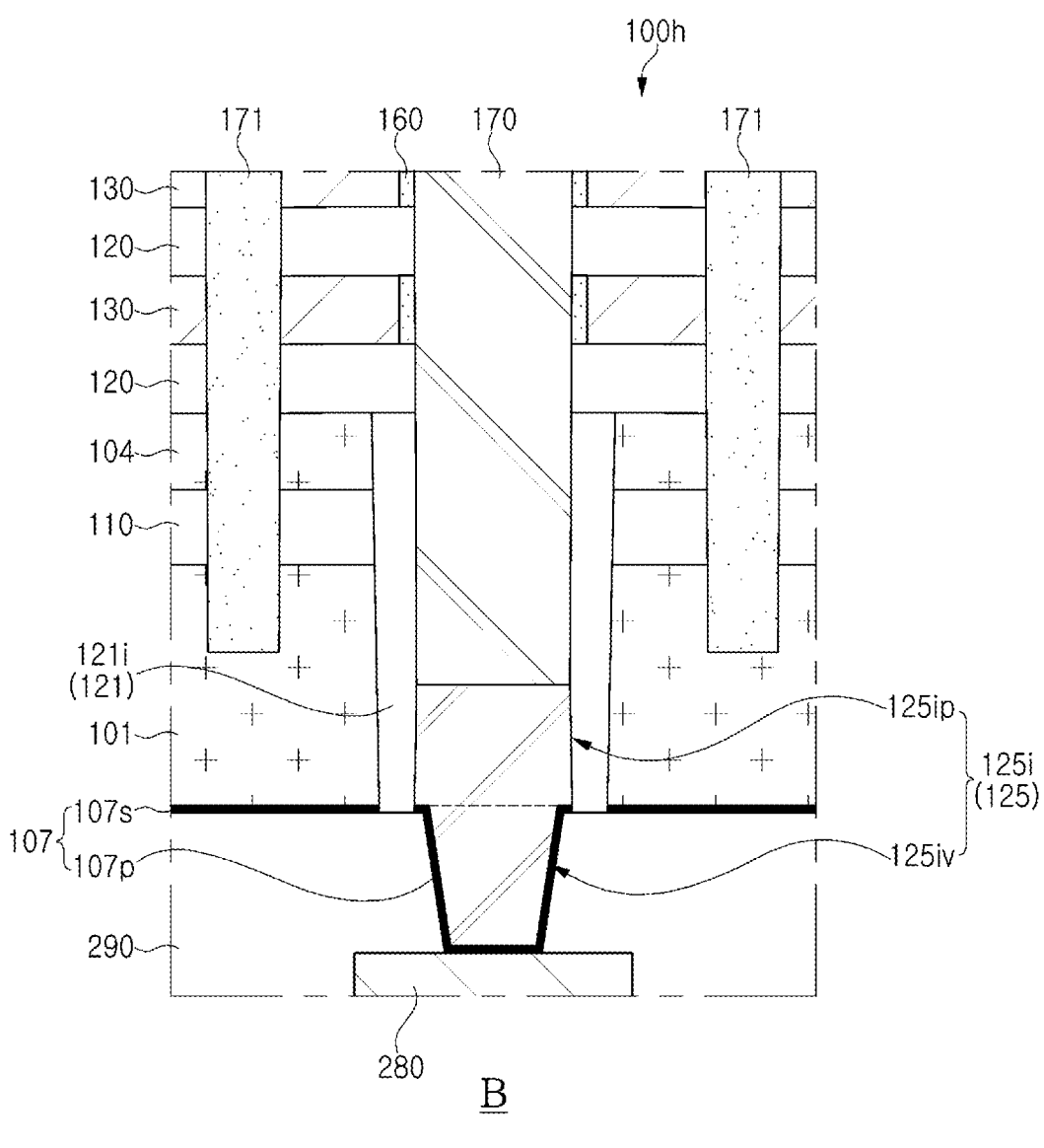

FIGS. 6A and 6B are partially enlarged views of a semiconductor device according to example embodiments. FIGS. 6A and 6B are partially enlarged views of a region corresponding to region "B" of FIG. 2A.

Referring to FIG. 6A, a semiconductor device 100g according to some example embodiments may have a landing pad 125 structure that is different from that of FIG. 3A.

The inner landing pad 125i may include a via portion 125iv and a pad portion 125ip. In contrast to FIG. 3A, the pad part 125ip may not include a second pad portion 125ip_2 (see FIG. 3A) that includes an insulating material. Thus, a portion corresponding to the first to third pad portions 125ip_1, 125ip_2, 125ip_3 (see FIG. 3A) may be a pad portion 125ip (e.g., a single pad portion 125ip) formed of a single conductive material. This may be because an additional process is performed to remove the second pad portion 125ip_2 including the insulating material, or because a horizontal insulating layer 110 is not formed on a region in which an inner landing pad 125i is to be formed in a process of forming the horizontal insulating layer 110. Accordingly, a semiconductor device having improved electrical characteristics such as an increase in a contact area between the gate contact plugs 170 and the landing pad 125 may be provided.

Referring to FIG. 6B, a semiconductor device 100h according to some example embodiments may include a structure of a landing pad 125 and a structure of gate contact plugs 170, different from those of FIG. 3A.

Each of the gate contact plugs 170 may have a relatively wide width, as compared with that of FIG. 3A. Accordingly, a portion of side surfaces of the gate contact plugs 170 may contact an internal side surface of an inner substrate insulating layer 121i. Accordingly, the landing pad 125 may not include the second pad portion 125ip_2 (see FIG. 3A) including an insulating material. This may be because the remaining second pad portion 125ip_2 and the third pad portion 125ip_3 may be removed as widths of the gate contact plugs 170 are increased in a subsequent process. Accordingly, a semiconductor device having electrical characteristics improved by addressing a process defect issue caused by the second pad portion 125ip_2 may be provided.

Figure 7:
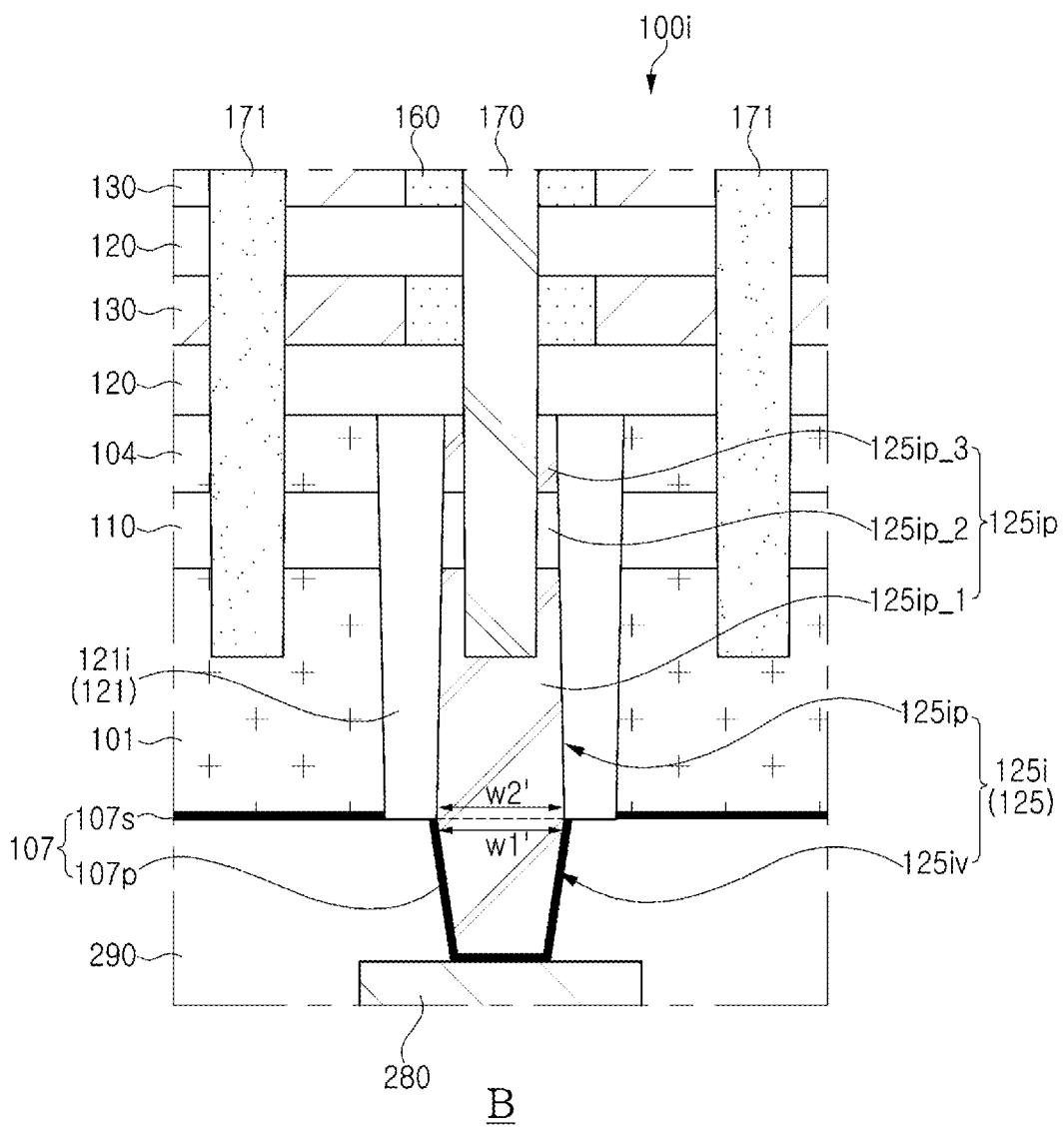
FIG. 7 is a partially enlarged view of a semiconductor device according to some example embodiments.

FIG. 7 is a partially enlarged view of a semiconductor device 100i according to some example embodiments. FIG. 7 is a partially enlarged view of a region corresponding to region "B" of FIG. 2A.

Referring to FIG. 7, in a first horizontal direction (for example, an X-direction), a first width w1' of a via portion 125iv of an inner landing pad 125i may be substantially the same as a second width w2' of a pad portion 125ip. This may be because an inner substrate insulating layer 121i may be formed to have a relatively high thickness, or a radius of an internal side surface of the inner substrate insulating layer 121i is relatively decreased.

Figure 8:
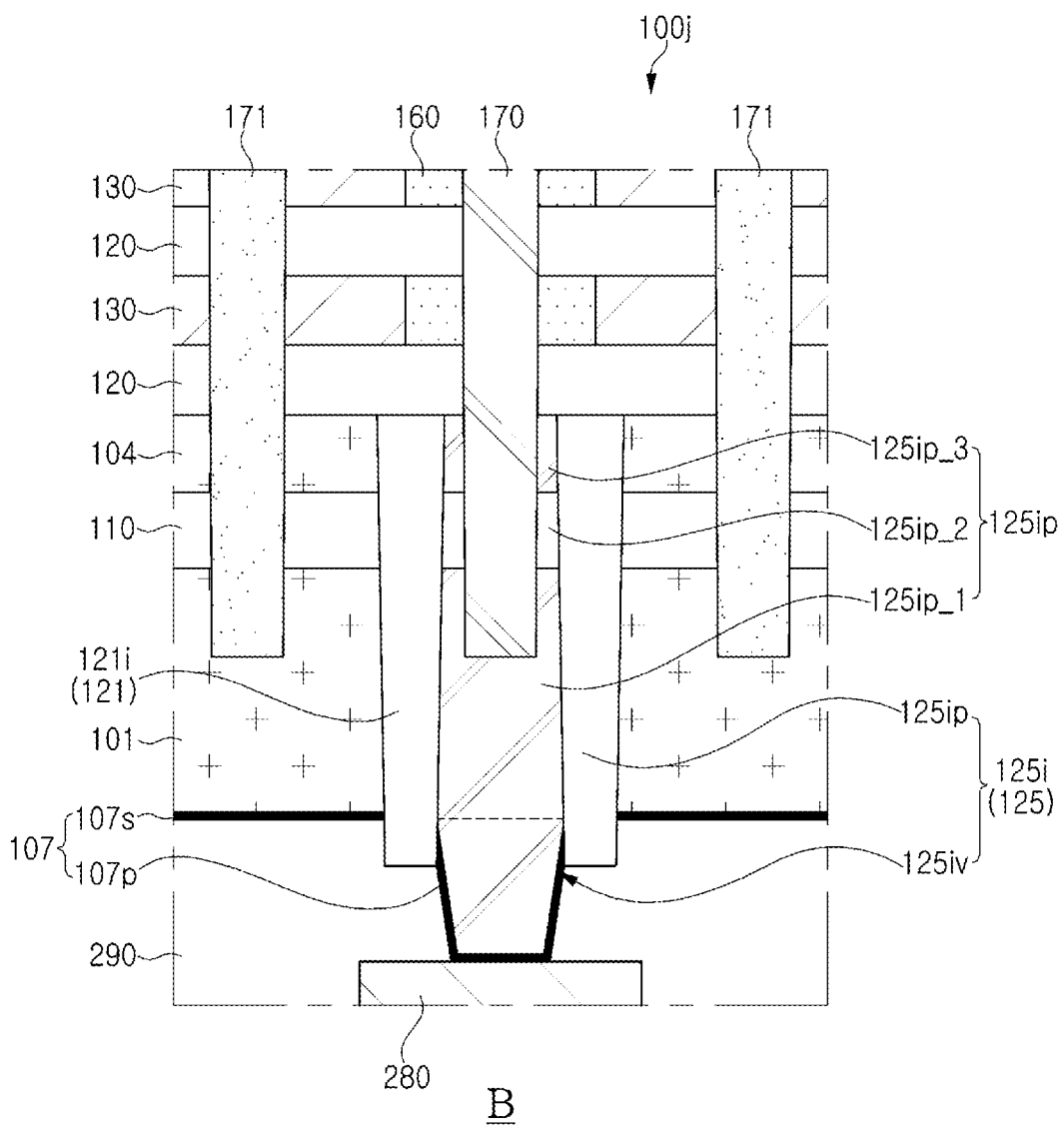
FIG. 8 is a partially enlarged view of a semiconductor device according to some example embodiments.

FIG. 8 is a partially enlarged view of a semiconductor device 100j according to some example embodiments. FIG. 8 is a partially enlarged view of a region corresponding to region "B" of FIG. 2A.

Referring to FIG. 8, in a semiconductor device 100j, a lower end of an inner substrate insulating layer 121i may extend to a level that is lower than a level of a lower surface of a substrate barrier layer 107s included in a barrier layer 107.

The inner substrate insulating layer 121i may extend through the barrier layer 107 to divide the barrier layer 107 into a substrate barrier pattern 107s and a landing pad barrier pattern 107p. In some example embodiments, an uppermost end of the landing pad barrier pattern 107p may be at a level that is lower than a level of a lower surface of the substrate barrier pattern 107s. An uppermost end of the landing pad barrier pattern 107p may contact the inner substrate insulating layer 121i.

Figure 9:
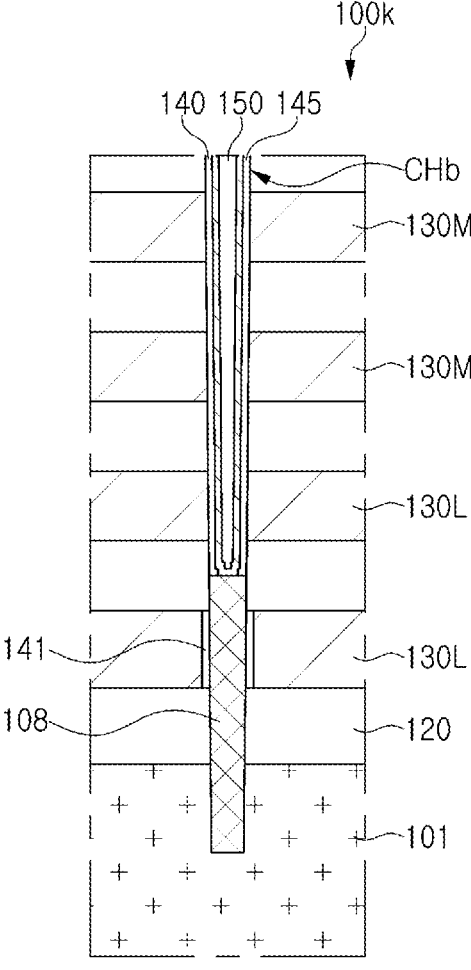
FIG. 9 is a partially enlarged view of a semiconductor device according to some example embodiments.

FIG. 9 is a partially enlarged view of a semiconductor device 100k according to some example embodiments. FIG. 9 is a partially enlarged view of a region corresponding to region "D" of FIG. 2B.

Referring to FIG. 9, in the semiconductor device 100k according to some example embodiments, a memory cell structure CELL may not include first and second horizontal conductive layers 102 and 104 and a horizontal insulating layer 110 on a second substrate 101, in contrast to the example embodiments of FIGS. 2A and 2B. In addition, a channel structure CHb may further include an epitaxial layer 108.

An epitaxial layer 108 may be on the second substrate 101 on a lower end of the channel structure CHb, and may be on a side surface of the at least one gate electrode 130. The epitaxial layer 108 may be in a recessed region of the second substrate 101. A height of a upper surface of the epitaxial layer 108 may be greater than a height of an upper surface of a lowermost lower gate electrode 130L and less than a height of a lower surface of an overlying lower gate electrode 130L, but example embodiments are not limited to that illustrated in the drawing. Stated differently, the upper surface of the epitaxial layer 108 may be between an upper surface of a lowermost lower gate electrode 130L and a lower surface of a lower gate electrode 130L immediately above the lowermost lower gate electrode 130L. The epitaxial layer 108 may be connected to the channel layer 140 through the upper surface thereof. A gate insulating layer 141 may be further between the lower gate electrodes 130L contacting the epitaxial layer 108.

Figure 10A:
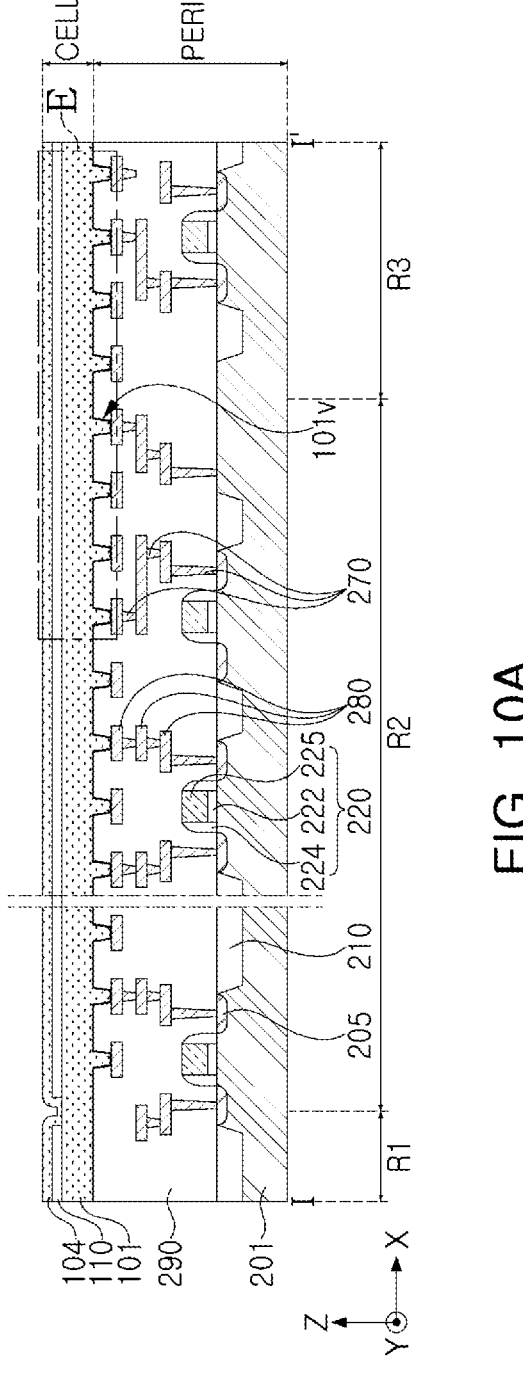
FIGS. 10A, 10B, 10C, 11A, 11B, 11C, 12, 13, 14, and 15 are schematic cross-sectional views, plan views, and partially enlarged views illustrating a method of fabricating a semiconductor device according to some example embodiments.

FIGS. 10A to 15 are schematic cross-sectional views and partially enlarged views illustrating a method of fabricating a semiconductor device 100 according to some example embodiments. FIGS. 10A, 11A, 12, 13, 14, and 15 are cross-sectional views illustrating a portion corresponding to FIG. 2A, FIG. 10B is a partially enlarged view of region "E" of FIG. 10A, FIG. 10C is a plan view corresponding to the partially enlarged view of FIG. 10B, FIG. 11B is a partially enlarged view of region "F" of FIG. 11A, and FIG. 11C is a plan view corresponding to the partially enlarged view of FIG. 11B.

Figure 10B:
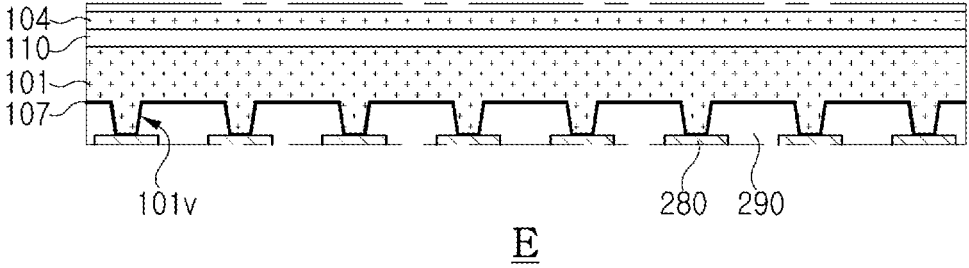
Figure 10C:
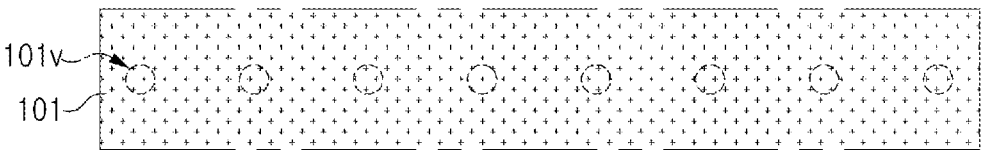

Referring to FIGS. 10A to 10C, a peripheral circuit structure PERI including circuit devices 220 and lower interconnection structures may be formed on a first substrate 201, and a second substrate 101 provided with a memory cell structure CELL, a horizontal insulating layer 110, and a second horizontal conductive layer 104 may be formed on the peripheral circuit structure PERI.

Isolation layers 210 may be formed in the first substrate 201, and a circuit gate dielectric layer 222 and a circuit gate electrode 225 may be formed on the first substrate 201. The isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 and the circuit gate electrode 225 may be sequentially formed. The circuit gate dielectric layer 222 may be formed of a silicon oxide, and the circuit gate electrode 225 may be formed of at least one of polycrystalline silicon or a metal silicide, but example embodiments are not limited thereto. Then, a spacer layer 224 and source/drain regions 205 may be formed on opposite sidewalls of the circuit gate dielectric layer 222 and the circuit gate electrode 225. In example embodiments, the spacer layer 224 may include a plurality of layers. Then, an ion implantation process may be performed to form the source/drain regions 205.

In the lower interconnection structures, circuit contact plugs 270 may be formed by forming a portion of a peripheral region insulating layer 290, etching the portion to be removed, and filling the removed portion with a conductive material. A circuit interconnection lines 280 may be formed by, for example, depositing a conductive material and then patterning the deposited conductive material.

The peripheral region insulating layer 290 may include a plurality of insulating layers. A portion of the peripheral region insulating layer 290 may be formed in each process of forming the lower interconnection structures and another portion thereof may be formed on an uppermost circuit interconnection line 280, so that the peripheral region insulating layer 290 may be formed to cover circuit devices 220 and the lower interconnection structures. Accordingly, the peripheral circuit structure PERI including the circuit devices 220 and the lower interconnection structures 270 and 280 may be formed.

Portions of the peripheral region insulating layer 290 may be removed through an anisotropic etching process to form via holes and to expose the uppermost lower interconnection line 280. A barrier layer 107 may be formed to cover and conform to an upper surface of the peripheral region insulating layer 290, sidewall of the via holes, and the exposed lower interconnection line 280, and the second substrate 101 may be formed in the via holes. The second substrate 101 may be formed of, for example, polycrystalline silicon and may be formed in a CVD process. Polycrystalline silicon forming the second substrate 101 may include impurities. In some example embodiments, a polysilicon portion in the via hole may be referred to as a second substrate via 101v. At least a portion of the second substrate via 101v may be replaced with via portions 125iv and 125ov (see FIG. 2A) of the landing pad 125 (see FIG. 2A) in a subsequent process.

Figure 11A:
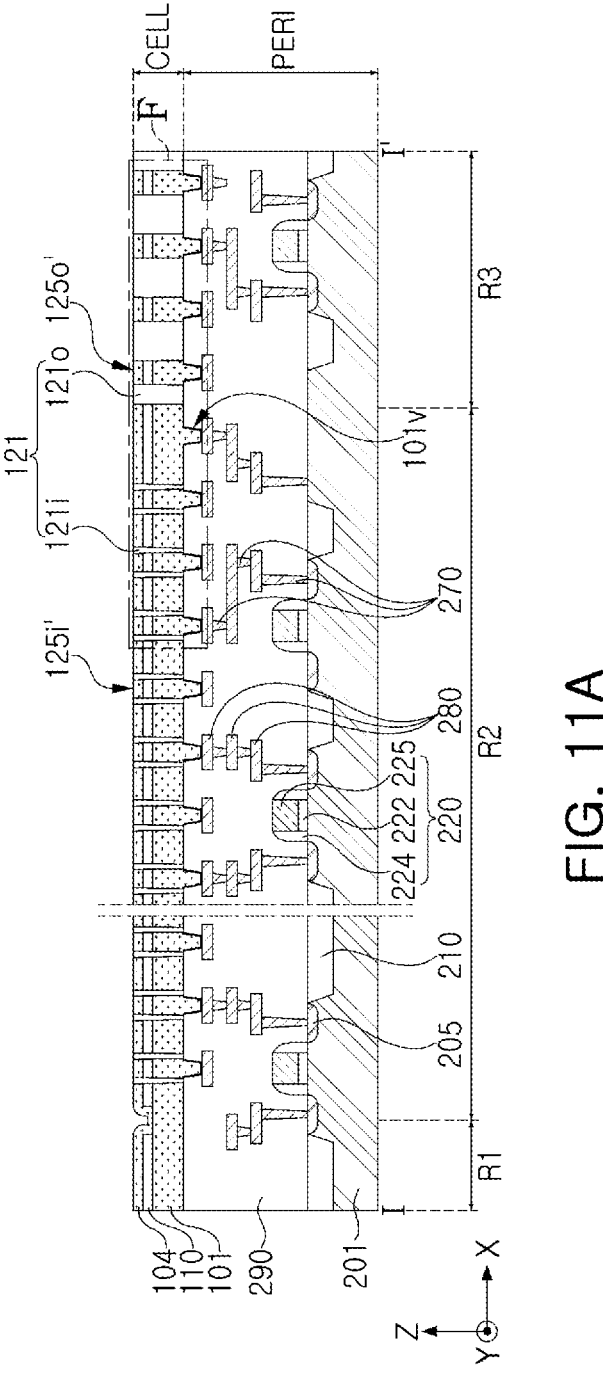
Figure 11B:
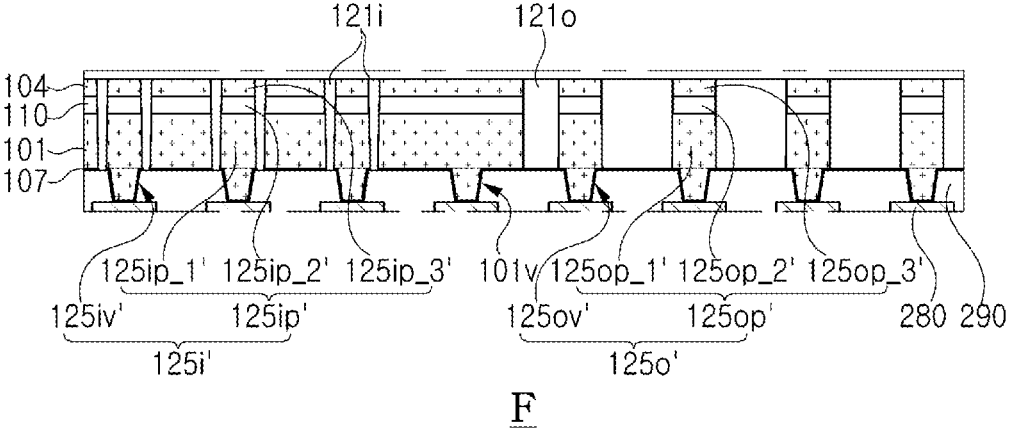
Figure 11C:
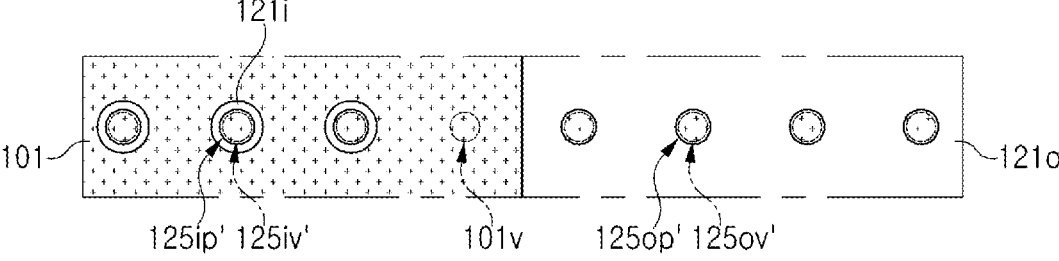

Referring to FIGS. 11A to 11C, a horizontal insulating layer 110 and a second horizontal conductive layer 104 may be formed on the second substrate 101, and a substrate insulating layer 121 may be formed.

In some embodiments, first and second horizontal insulating layers constituting the horizontal insulating layer 110 may be alternately stacked on the second substrate 101. The horizontal insulating layer 110 may include layers partially replaced with the first horizontal conductive layer 102 of FIG. 2A in a subsequent process. The first horizontal insulating layers may include a material that is different from that of the second horizontal insulating layer. For example, the first horizontal insulating layers may be formed of the same material as the interlayer insulating layers 120, and the second horizontal insulating layer may be formed of the same material as subsequently formed sacrificial insulating layers 118. A portion of the horizontal insulating layer 110 may be removed by a patterning process in regions, for example, a second region R2 of the second substrate 101.

A second horizontal conductive layer 104 may be formed on the horizontal insulating layer 110, and may contact the second substrate 101 in a region in which the horizontal insulating layer 110 is removed. Accordingly, the second horizontal conductive layer 104 may be bent along end portions of the horizontal insulating layer 110, cover the end portions, and extend upwardly of the second substrate 101.

The substrate insulating layer 121 may be formed by removing portions of the second substrate 101, the horizontal insulating layer 110, and the second horizontal conductive layer 104 through an etching process and then filling the removed portions with an insulating material. In some example embodiments, the substrate insulating layer 121 may extend through the barrier layer 107, and a lower surface of the substrate insulating layer 121 may be at substantially the same level as the lower surface of the barrier layer 107. However, the substrate insulating layer 121 may have a lower surface having a lower level according to conditions of the etching process. The substrate insulating layer 121 may divide the barrier layer 107 into a substrate barrier pattern 107s and a landing pad barrier pattern 107p. The insulating material may include, for example, a silicon oxide, a silicon nitride, or a silicon oxynitride. After filling the insulating material, a planarization process may be further performed using a chemical mechanical polishing (CMP) process. Accordingly, the upper surface of the substrate insulating layer 121 may be substantially coplanar with an upper surface of the second horizontal conductive layer 104.

The substrate insulating layer 121 may include an inner substrate insulating layer 121i in the second region R2, in which the gate contact plugs 170 (see FIG. 2A) are arranged, and an outer substrate insulating layer 121o in a third region R3 in which the through-contact plug 175 (see FIG. 2A) is disposed.

The inner substrate insulating layer 121i may be formed by forming an inner opening having an annular shape and having a ring shape on a plane in an etching process, and filling the inner opening with an insulating material. The second substrate 101, the second substrate via 101v, the horizontal insulating layer 110, and the second horizontal conductive layer 104 surrounded by the inner opening may be referred to as a preliminary inner landing pad 125i'. The preliminary inner landing pad 125i' may include a preliminary via portion 125iv' corresponding to the second substrate via 101v, a first preliminary pad portion 125ip_1' corresponding to the second substrate 101, a second preliminary pad portion 125*ip*_2' corresponding to the horizontal insulating layer 110, and a third preliminary pad portion 125*ip*_3' corresponding to the second horizontal conductive layer 104. The inner opening may be formed to have a planar area that is larger than a planar area of the second substrate via 101*v*, so that a planar area of the preliminary pad portion 125*ip*' that is surrounded by the inner opening may be larger than a planar area of the preliminary via portion 125*iv*'.

The outer substrate insulating layer 121*o* may be formed by forming an outer opening in a region, other than a portion in which a through-contact plug 175 is to be formed, in an etching process, and then filling the outer opening with an insulating material. The second substrate 101, the second substrate via 101*v*, the horizontal insulating layer 110, and the second horizontal conductive layer 104 surrounded by the outer opening may be referred to as a preliminary outer landing pad 125*o*'. The preliminary outer landing pad 125*o*' may include a preliminary via portion 125*ov*' corresponding to the second substrate via 101*v*, a first preliminary pad portion 125*io*_1' corresponding to the second substrate 101, a second preliminary pad portion 125*io*_2' corresponding to the horizontal insulating layer 110, and a third preliminary pad portion 125*io*_3' corresponding to the second horizontal conductive layer 104.

The inner substrate insulating layer 121*i* may have an annular shape, so that a preliminary inner landing pad 125*i*' having an upper surface having substantially the same level as the second horizontal conductive layer 104 may be formed. The outer substrate insulating layer 121*o* may be formed by performing an etching process on a region, other than a region in which the preliminary outer landing pad 125*o*' is to be formed, so that the preliminary outer landing pad 125*o*' may be formed to have an upper surface having substantially the same level as the second horizontal conductive layer 104.

Figure 12:
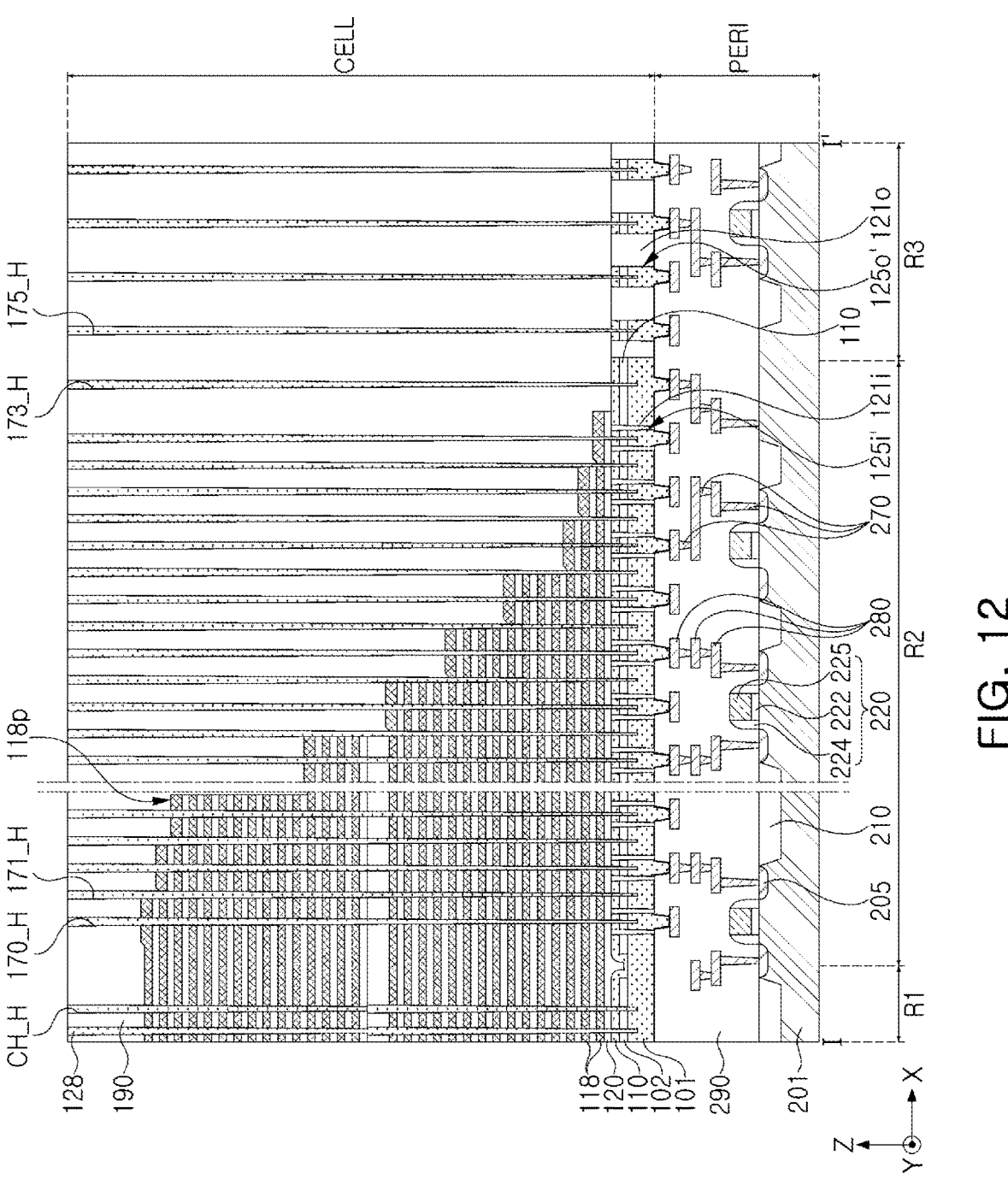

Referring to FIG. 12, sacrificial insulating layers 118 and interlayer insulating layers 120 constituting a stack structure may be alternately stacked on the second horizontal conductive layer 104, a stepped structure may be formed, openings CH_H, 170_H, 171_H, 173_H, and 175_H may be formed, and first vertical sacrificial layer 128 may then be formed in the openings CH_H, 170_H, 171_H, 173_H, and 175_H.

The sacrificial insulating layers 118 and the interlayer insulating layers 120 may be alternately stacked on the second horizontal conductive layer 104. The sacrificial insulating layers 118 may be replaced with the gate electrodes 130 (see FIG. 2A) in a subsequent process. The sacrificial insulating layers 118 may be formed of a material that is different from that of the interlayer insulating layers 120, and may be formed of a material which may be etched with etching selectivity with respect to the interlayer insulating layers 120 under specific etching conditions. For example, the interlayer insulating layers 120 may be selected from a silicon, a silicon oxide, a silicon carbide, and a silicon nitride, but may be formed of a material that is different from that of the interlayer insulating layers 120. In example embodiments, thicknesses of the interlayer insulating layers 120 may not all be the same. The thickness of the interlayer insulating layers 120 and the sacrificial layers 118 and the number of films, constituting the interlayer insulating layers 120 and the sacrificial layers 118, may be variously changed from those illustrated.

A photolithography process and an etching process may be repeatedly performed on the sacrificial insulating layers 118 using a mask layer such that the upper sacrificial insulating layers 118 extend less than the lower sacrificial insulating layers 118 on the second region R2. Accordingly, the sacrificial insulating layers 118 may constitute a stepped structure having a staircase shape in a predetermined unit, and the sacrificial gate pad regions 118P in an uppermost portion of the sacrificial insulating layers 118 may be upwardly exposed. As an insulating layer such as a silicon nitride layer is additionally formed, the sacrificial gate pad regions 118P may have a thickness, higher than a thickness of the other regions of the adjacent sacrificial insulating layers 118. The sacrificial gate pad region 118P may be replaced with a conductive material in a subsequent process to form a gate pad region 130P of each of the gate electrodes 130.

A cell region insulating layer 190 may be formed to cover the stack structure, and openings CH_H, 170_H, 171_H, 173_H, and 175_H may be formed by the same etching process to extend through the cell region insulating layer 190. The openings CH_H, 170_H, 171_H, 173_H, and 175_H may include channel holes CH_H on the first region R1, gate contact holes 170_H on the second region R2, support holes 171_H, a substrate contact hole 173_H, and a through-contact hole 175_H on the third region R3. The channel holes CH_H may penetrate through the stack structure to expose the second substrate 101 and may be openings in which the channel structures CH (see FIG. 2A) are formed in a subsequent process. The gate contact holes 170_H may extend through the stack structure to expose the preliminary inner landing pad 125*i*', and may be openings in which gate contact plugs 170 (see FIG. 2A) are formed through a subsequent process. The support holes 171_H may extend through the stack structure to expose the second substrate 101 and may be openings in which a plurality of support structures 171 (see FIG. 2A) are formed in a subsequent process. The substrate contact hole 173_H may be spaced apart from the stack structure to expose the second substrate 101 and may be an opening in which a substrate contact plug 173 (see FIG. 2A) is formed in a subsequent process. The through-contact hole 175_H may be spaced apart from the stack structure to expose the preliminary outer landing pad 125*o*' and may be an opening in which a through-contact plug 175 (see FIG. 2A) is formed in a subsequent process.

Lower surfaces of each of the openings CH_H, 170_H, 171_H, 173_H, and 175_H may be at a level that is higher than a level of the lower surface of the second substrate 101. The openings CH_H, 170_H, 171_H, 173_H, and 175_H may be formed by the same etching process to have lower surfaces having substantially the same level and upper surfaces having substantially the same level. The gate contact holes 170_H and the through-contact hole 175_H may include portions in which the preliminary inner and outer landing pads 125*i*' and 125*o*' are on a level that is higher than a level of the lower surface of the second substrate 101, so that the channel holes CH_H or the support holes 171_H may be formed by the same etching process. Accordingly, a semiconductor device having improved productivity such as a relative decrease in the number of processes may be provided. Also, the gate contact holes 170_H and the through-contact hole 175_H may not extend to a level that is lower than the level of the lower surface of the second substrate 101, and defects such as penetration of the landing pad barrier pattern 107*p* may be prevented to reduce a difficulty in process.

A sacrificial material may be deposited in the openings CH_H, 170_H, 171_H, 173_H, and 175_H and a planarization process may be performed, so that a first vertical sacrificial layer 128 may fill the openings CH_H, 170_H, 171_H, 173_H, and 175_H. The sacrificial material may include, for example, polycrystalline silicon.

Figure 13:
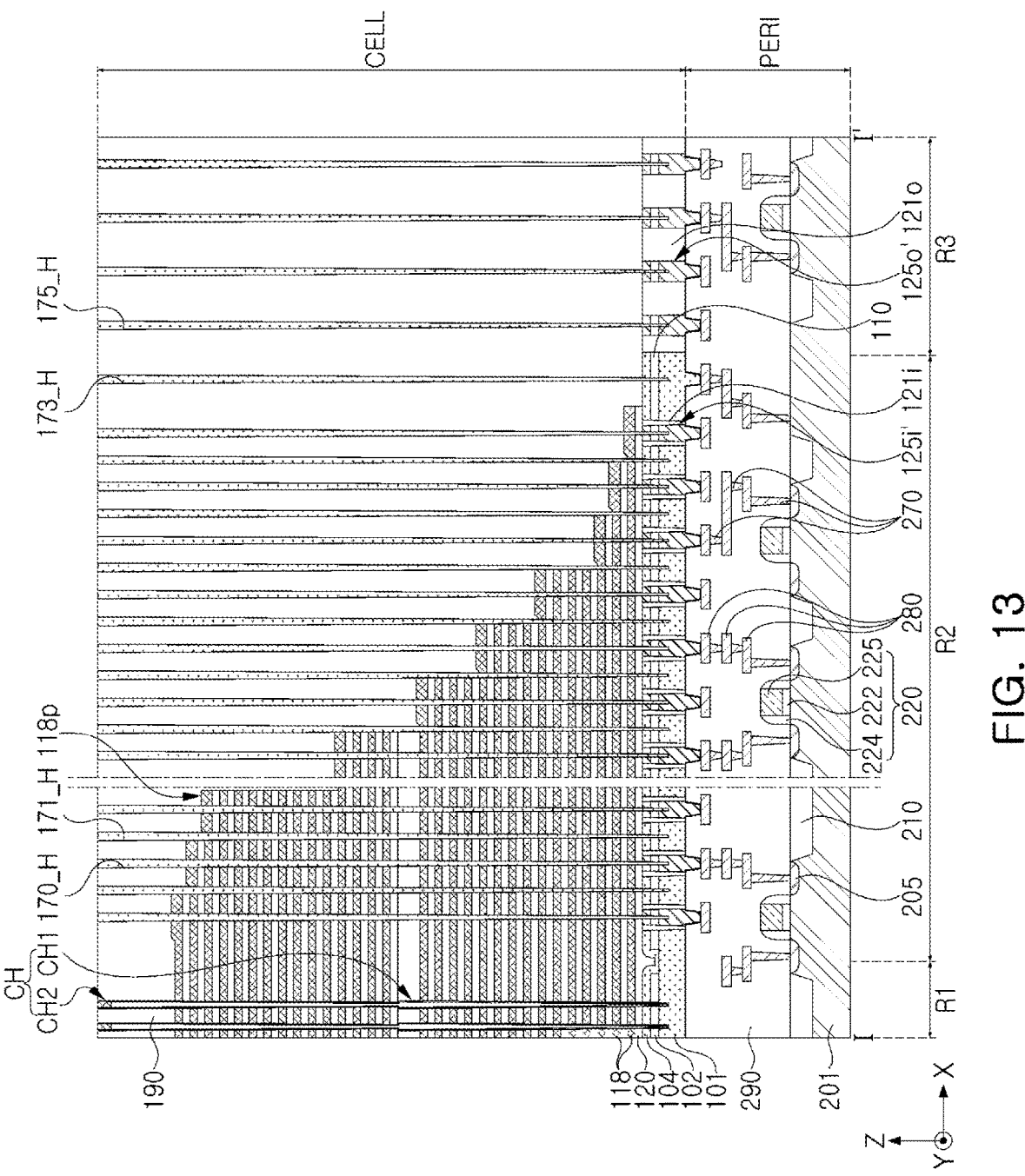

Referring to FIG. 13, channel structures CH may be formed.

The first vertical sacrificial layer 128 in the channel holes CH_H may be removed, and the gate dielectric layer 145, the channel layer 140, the channel filling insulating layer 147, and the channel pad 149 may be formed (e.g., sequentially formed) in the channel holes CH_H to form channel structures CH. The channel layer 140 may be formed of a conductive material, for example, polycrystalline silicon.

Figure 14:
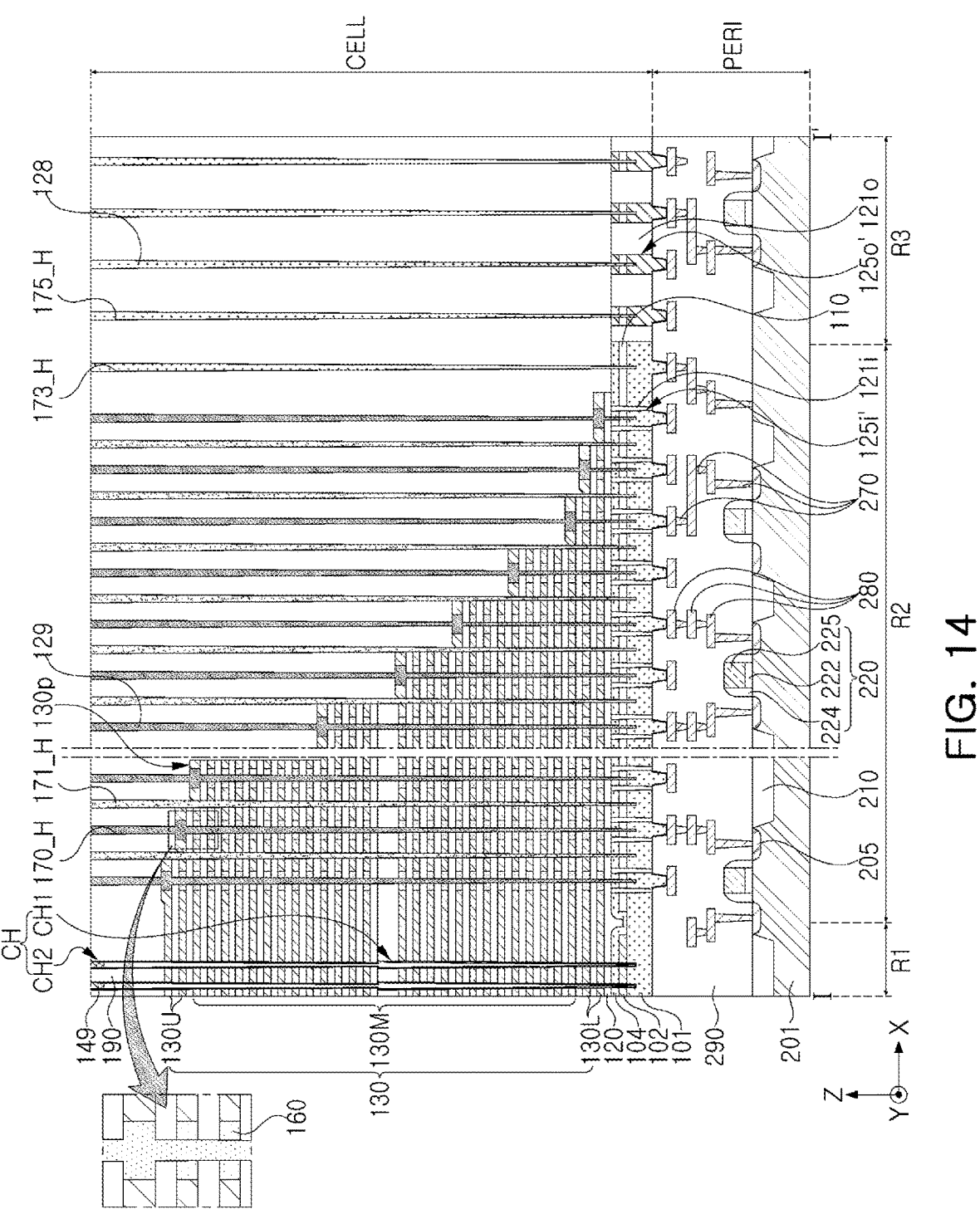

Referring to FIG. 14, an insulating structure 160 may be formed, a plurality of support structures 171 may be formed, and a first horizontal conductive layer 102 and gate electrodes 130 may be formed.

The first vertical sacrificial layer 128 in the gate contact holes 170_H may be selectively removed in an etching process and a portion of the sacrificial insulating layers 118, exposed through the gate contact holes 170_H, may be removed to form a tunnel portions. An insulating structure 160 may be formed by filling the tunnel portions with an insulating material, for example, a silicon oxide, a silicon nitride, a silicon oxynitride, and/or combinations thereof. The insulating structure 160 may not be formed in a portion in which each of the gate contact holes 170_H extends through the sacrificial gate pad region 118P. Then, a second vertical sacrificial layer 129 may be formed in the gate contact holes 170_H.

A plurality of support structures 171 are formed by removing the first vertical sacrificial layer 128 in the support holes 171_H and filling the removed portion with the insulating material, for example, a silicon oxide, a silicon nitride, or a silicon oxynitride.

In some example embodiments, the first vertical sacrificial layer 128 in the support holes 171_H may be removed together with the first vertical sacrificial layer 128 in the gate contact holes 170_H and a portion of the sacrificial insulating layers 118 exposed by the support holes 171_H may be removed to form a tunnel portion, and then a second vertical sacrificial layer 129 may be formed and the second vertical sacrificial layer 129 in the support holes 171_H may be separately removed and a removed portion may be filled with an insulating material to form support structures having horizontal extension portions.

In the locations of the first and second separation regions MS1 and MS2 (see FIG. 1A), openings may be formed to extend to the second substrate 101 through the sacrificial insulating layers 118 and the interlayer insulating layers 120. An etch-back process may be performed while forming additional sacrificial spacer layers in the openings, so that the horizontal insulating layer 110 may be selectively removed and a portion of the exposed gate dielectric layer 145 may be removed together on the first region R1. A first horizontal conductive layer 102 may be formed by depositing a conductive material in the region in which the horizontal insulating layer 110 has been removed, and the sacrificial spacer layers may then be removed in the openings. By the present process, the first horizontal conductive layer 102 may be formed on the first region R1.

The sacrificial insulating layers 118 may be selectively removed with respect to the interlayer insulating layers 120, the second horizontal conductive layer 104, and the substrate insulating layer 121 using, for example, wet etching to form the tunnel portions, and a gate electrodes 130 may be formed by filling the tunnel portions with a conductive material. The conductive material may fill the tunnel portions. The conductive material may include a metal, polycrystalline silicon, or a metal silicide material. After the gate electrodes 130 are formed, a separation insulating layer 105 (see FIG. 2B) may be formed in the openings formed in the first and second separation regions MS1 and MS2.

Figure 15:
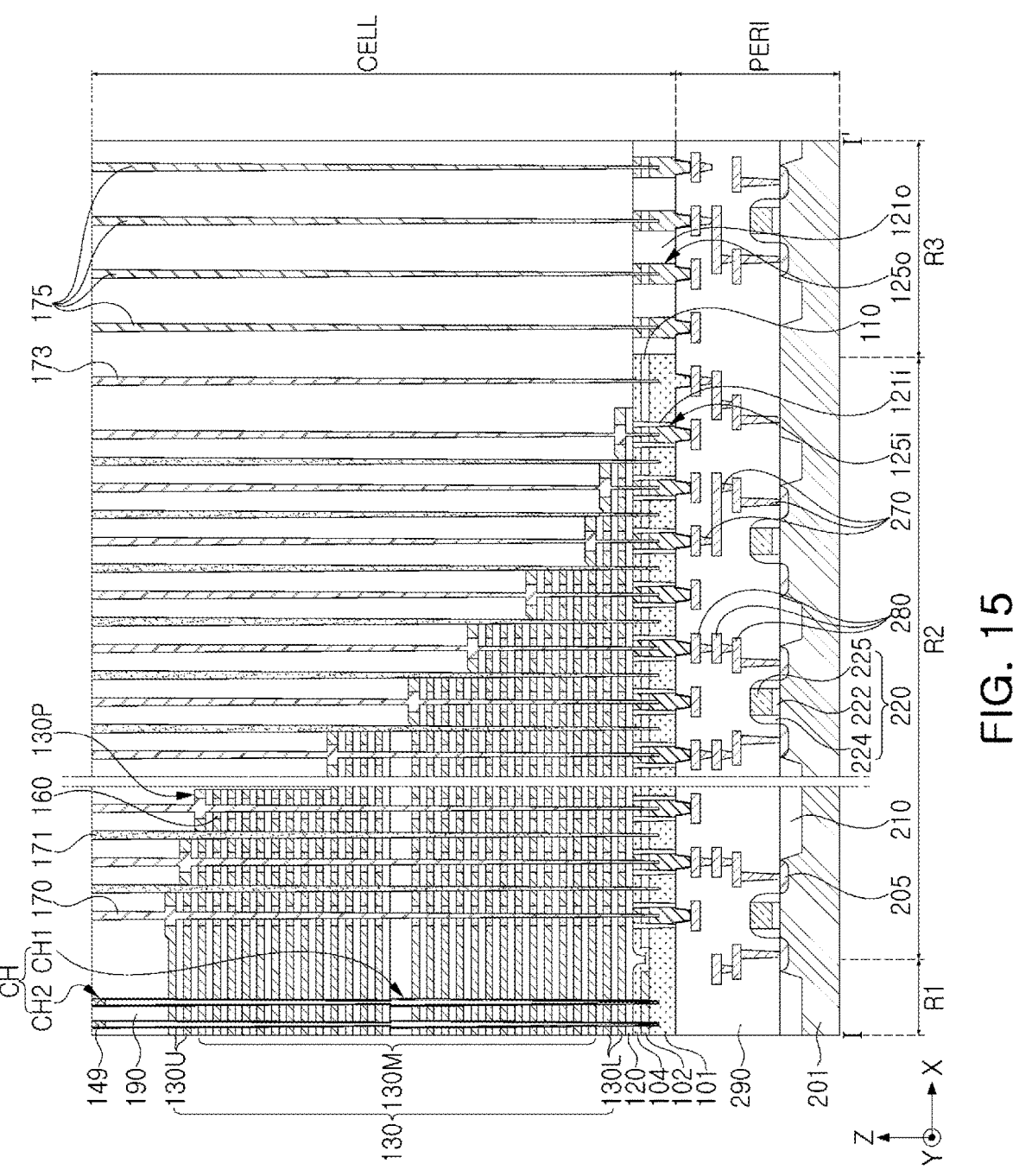

Referring to FIG. 15, landing pads 125i and 125o may be formed, and gate contact plugs 170 and through-contact plugs 175 may be formed.

The second vertical sacrificial layer 129 in the gate contact holes 170_H and the first vertical sacrificial layer 128 in the through-contact hole 175_H are removed, and at least a portion of the preliminary inner landing pad 125i' and the preliminary outer landing pad 125o' may be removed. Remaining portions of the preliminary inner landing pad 125i', other than the second preliminary pad portion 125ip_2', may all be removed, and remaining portions of the preliminary outer landing pad 125o', other than the second preliminary pad portion 125op_2', may all be removed.

A conductive material may be deposited in the removed portions to form landing pads 125i and 125o. The conductive material may include tungsten (W), copper (Cu), aluminum (Al), or the like.

A conductive material may be deposited in the gate contact holes 170_H to form gate contact plugs 170, and a conductive material may be deposited in the through-contact hole 175_H to form the through-contact plug 175. Accordingly, the gate contact plugs 170 may be formed to have a horizontal extension portion 170H (see FIG. 3B) in the gate pad region 130P and may be electrically connected to the gate electrodes 130.

Referring to FIG. 2A together, an upper interconnection structure such as interconnection lines 195 may be formed to provide a semiconductor device 100.

Figure 16:
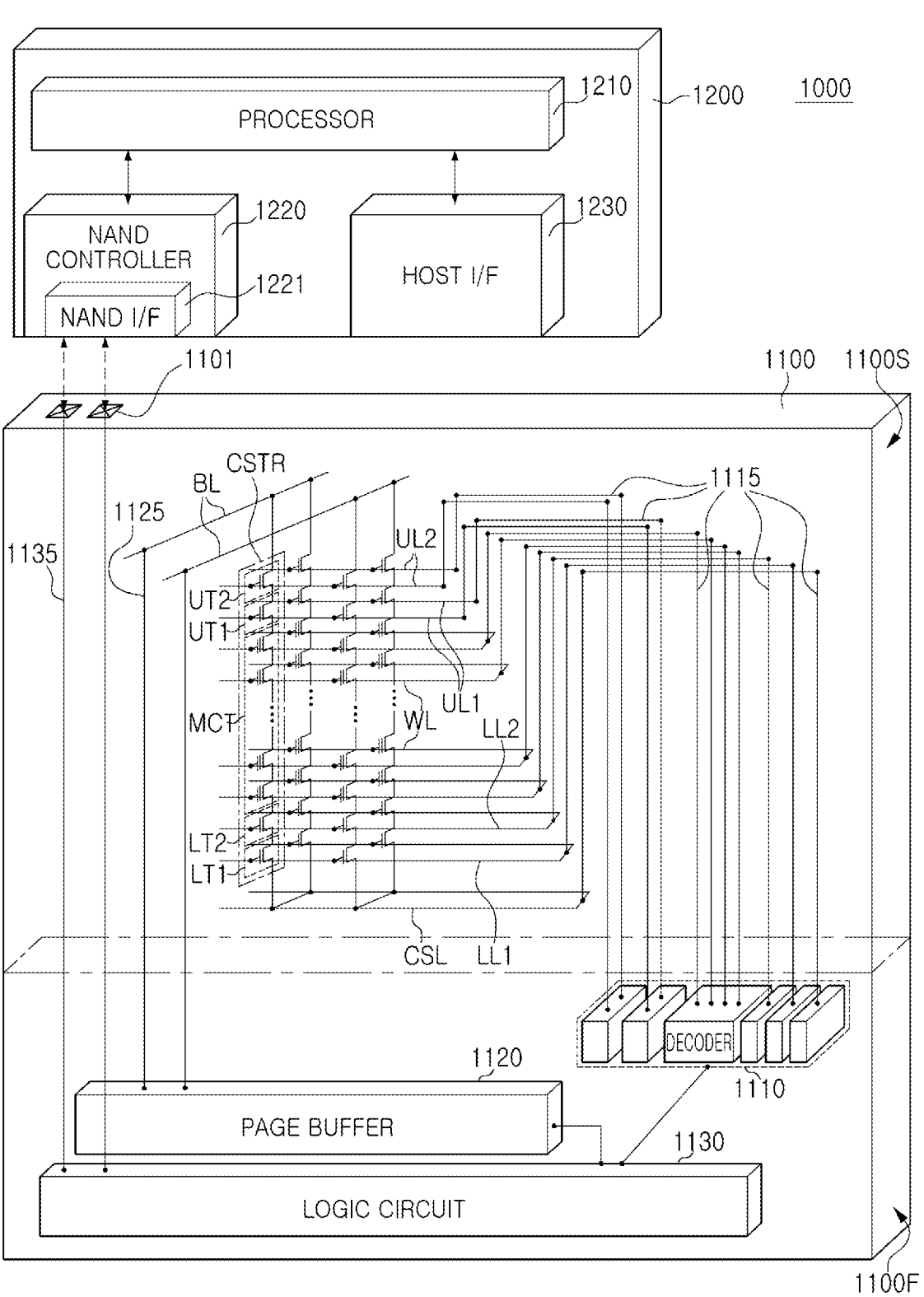
FIG. 16 is a schematic view of a data storage system including a semiconductor device according to some example embodiments.

FIG. 16 is a schematic view of a data storage system including a semiconductor device according to some example embodiments.

Referring to FIG. 16, a data storage system 1000 may include a semiconductor device 1100 and a controller 1200 that is electrically connected to the semiconductor device 1100. The data storage system 1000 may be a storage device that includes one or a plurality of semiconductor devices 1100, or the data storage system 100 may be an electronic device that includes such a storage device. In some embodiments, the data storage system 1000 may be a solid state drive device (SSD) including one or a plurality of semiconductor devices 1100, a universal serial bus (USB), a computing system, a medical device, or a communications device, as non-limiting examples.

The semiconductor device 1100 may be a nonvolatile memory device, for example, the NAND flash memory device described above with reference to FIGS. 1 to 9. The semiconductor device 1100 may include a first structure 1100F and a second structure 1100S on the first structure 1100F. In example embodiments, the first structure 1100F may be next to the second structure 1100S. The first structure 1100F may be a peripheral circuit structure including a decoder circuit 1110, a page buffer 1120, and a logic circuit 1130. The second structure 1100S may be a memory cell structure including a bitline BL, a common source line CSL, wordlines WL, first and second gate upper lines UL1 and UL2, first and second gate lower lines LL1 and LL2, and memory cell strings CSTR between the bitline BL and the common source line CSL.

In the second structure 1100S, each of the memory cell strings CSTR may include lower transistors LT1 and LT2 adjacent to the common source line CSL, upper transistors UT1 and UT2 adjacent to the bitline BL, and a plurality of memory cell transistors MCT between the lower transistors LT1 and LT2 and the upper transistors UT1 and UT2. The number of the lower transistors LT1 and LT2 and the number of the upper transistors UT1 and UT2 may vary according to embodiments.

In some example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The wordlines WL may be gate electrodes of the memory cell transistors MCT, and the gate upper lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the wordlines WL, and the first and second gate upper lines UL1 and UL2 may be electrically connected to the decoder circuit 1110 through first connection lines 1115 extending from the inside of the first structure 1100F to the second structure 1100S. The bitlines BL may be electrically connected to the page buffer 1120 through second connection lines 1125 extending from the inside of the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through the input/output pad 1101 electrically connected to the logic circuit 1130. The input/output pad 1101 may be electrically connected to the logic circuit 1130 through an input/output connection line 1135 extending from the inside of the first structure 1100F to the second structure 1100S.

The controller 1200 may include a processor 1210, a NAND controller 1220, and a host interface (I/F) 1230. In some embodiments, the data storage system 1000 may include a plurality of semiconductor devices 1100, and in this case, the controller 1200 may control the plurality of semiconductor devices 1000.

The processor 1210 may control an overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 handling communication with the semiconductor device 1100. Through the NAND interface 1221, a control command for controlling the semiconductor device 1100, data to be written to the memory cell transistors MCT of the semiconductor device 1100, data to be read from the memory cell transistors MCT of the semiconductor device 1100, or the like, may be transmitted. The host I/F 1230 may provide a communication function between the data storage system 1000 and an external host. When receiving a control command from an external host through the host I/F 1230, the processor 1210 may control the semiconductor device 1100 in response to the control command.

Figure 17:
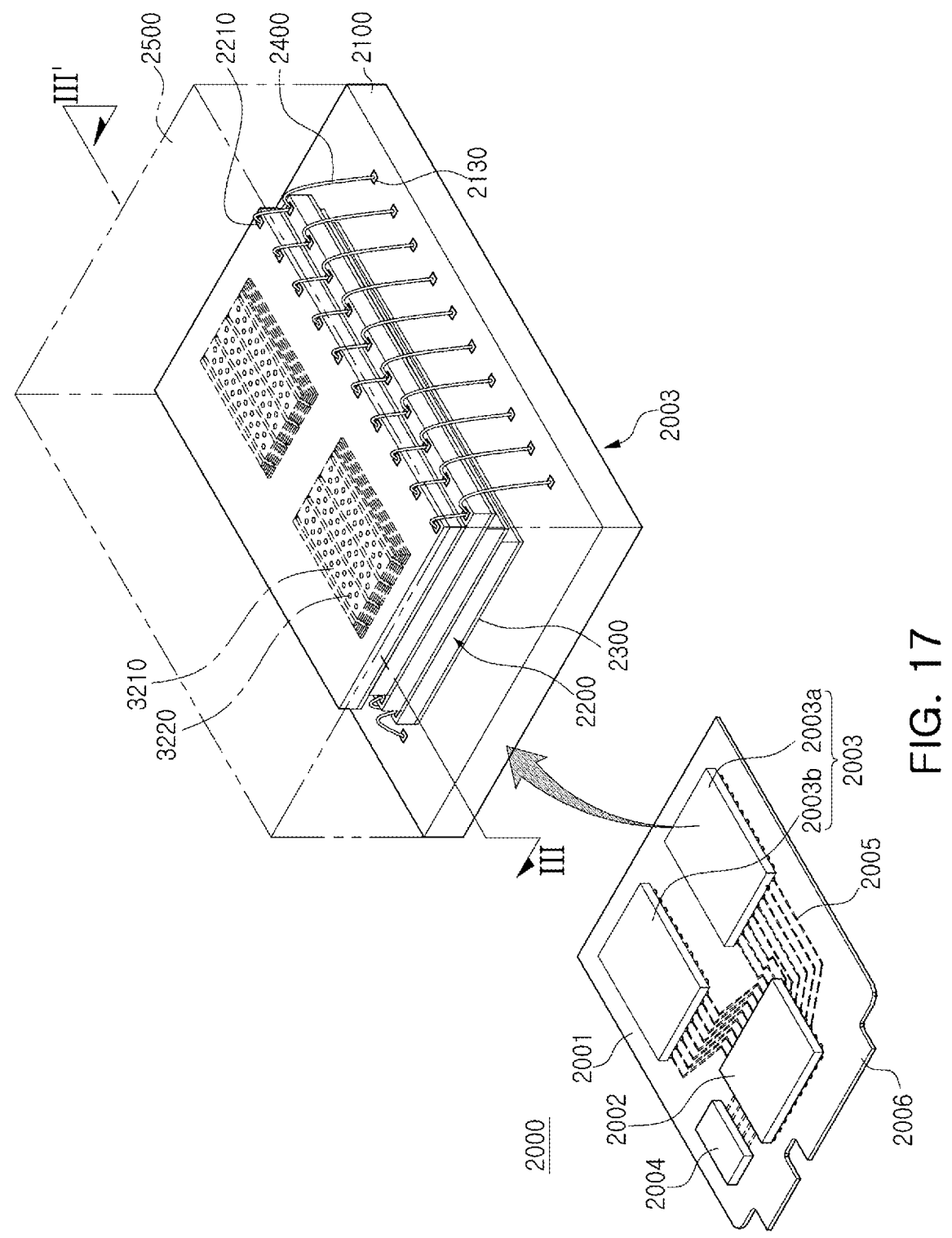
FIG. 17 is a schematic perspective view of a data storage system including a semiconductor device according to some example embodiments.

FIG. 17 is a schematic perspective view of a data storage system including a semiconductor device according to some example embodiments.

Referring to FIG. 17, a data storage system 2000 according to some example embodiments of the present inventive concepts may include a main board 2001, a controller 2002 mounted on the main board 2001, one or more semiconductor packages 2003, and DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between the data storage system 2000 and the external host. In some example embodiments, the data storage system 2000 may communicate with an external host according to any one of interfaces such as universal serial bus (USB), peripheral component interconnect express (PCI-Express), serial advanced technology attachment (SATA), M-PHY for universal flash storage (UFS), and/or the like. In some example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or read data from the semiconductor package 2003, and may improve an operating speed of the data storage system 2000.

The DRAM 2004 may be a buffer memory for mitigating a speed difference between the semiconductor package 2003 as a data storage space and an external host. The DRAM 2004 included in the data storage system 2000 may operate as a kind of cache memory, and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, and adhesive layers 2300 on respective lower surfaces of the semiconductor chips 2200, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a PCB including package upper pads 2130. Each semiconductor chip 2200 may include an input/output pad 2210. The input/output pad 2210 may correspond to the input/output pad 1101 of FIG. 16. Each of the semiconductor chips 2200 may include gate stack structures 3210 and channel structures 3220. Each of the semiconductor chips 2200 may include the semiconductor device described above with reference to FIGS. 1 to 9.

In some example embodiments, the connection structure 2400 may be a bonding wire electrically connecting the input/output pad 2210 and the package upper pads 2130. Accordingly, in each of the first and second semiconductor packages 2003*a* and 2003*b*, the semiconductor chips 2200 may be electrically connected to each other by a bonding wire method, and may be electrically connected to the package upper pads 2130 of the package substrate 2100. According to some example embodiments, in each of the first and second semiconductor packages 2003*a* and 2003*b*, the semiconductor chips 2200 may be electrically connected to each other by a connection structure including a through-electrode (a through-silicon via (TSV)), rather than the bonding wire-type connection structure 2400.

In some example embodiments, the controller 2002 and the semiconductor chips 2200 may be included in one package. In some example embodiments, the controller 2002 and the semiconductor chips 2200 may be mounted on a separate interposer substrate that is different from the main substrate 2001, and the controller 2002 and the semiconductor chips 2200 may be connected to each other by wiring formed on the interposer substrate.

Figure 18:
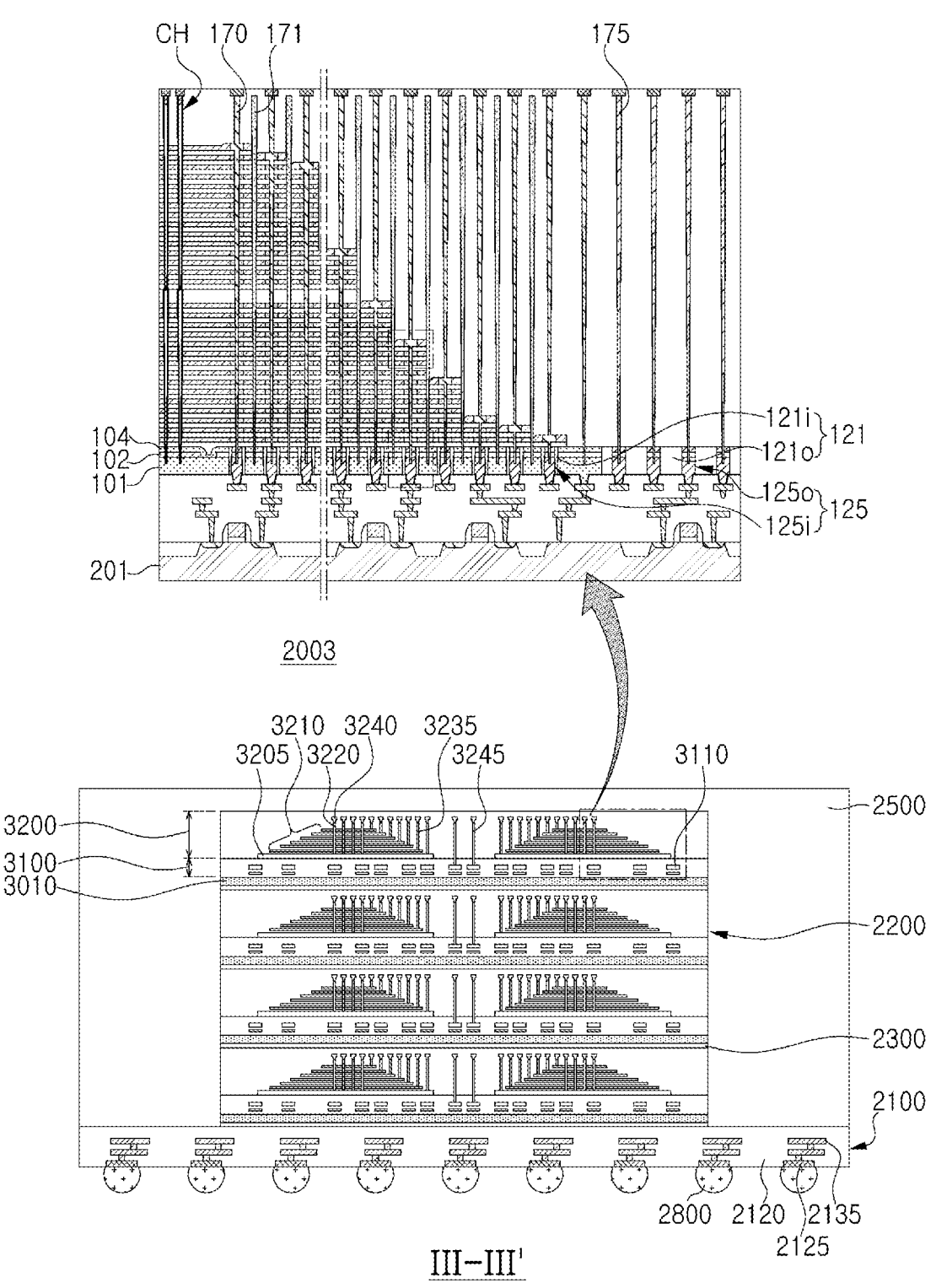
FIG. 18 is a schematic cross-sectional view of a semiconductor package according to some example embodiment some.

FIG. 18 is a schematic cross-sectional view of a semiconductor package according to some example embodiments. FIG. 18 illustrates an example embodiment of the semiconductor package 2003 of FIG. 17 and conceptually illustrates a region of the semiconductor package 2003 of FIG. 17, taken along line III-III'.

Referring to FIG. 18, in the semiconductor package 2003, the package substrate 2100 may be a printed circuit board (PCB). The package substrate 2100 may include a package substrate body portion 2120, package upper pads 2130 (see FIG. 12) on an upper surface of the package substrate body portion 2120, lower pads 2125 on a lower surface of the package substrate body portion 2120 or exposed through the lower surface, and internal wirings 2135 electrically connecting the upper pads 2130 and the lower pads 2125 inside the package substrate body portion 2120. The upper pads 2130 may be electrically connected to the connection structures 2400. The lower pads 2125 may be connected to the wiring patterns 2005 of the main board 2010 of the data storage system 2000 as illustrated in FIG. 17 through conductive connectors 2800.

Each of the semiconductor chips 2200 may include a semiconductor substrate 3010 and a first structure 3100 and a second structure 3200 that are sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, channel structures 3220 passing through the gate stack structure 3210 and separation regions, bitlines 3240 electrically connected to the memory channel structures 3220, and gate contact plugs 3235 electrically connected to the wordlines WL (see FIG. 11) of the gate stack structure 3210. As described above with reference to FIGS. 1 to 9, in each of the semiconductor chips 2200, the substrate insulating layer 121 may have an inner substrate insulating layer 121*i* having an annular shape and an outer substrate insulating layer 121*o* having a plate shape, and the landing pad 125 may include an inner landing pad 125*i* that is surrounded by the inner substrate insulating layer 121*i* and an outer landing pad 125*o* that is surrounded by the outer substrate insulating layer 121*o*.

Each of the semiconductor chips 2200 may include a through-wiring 3245 electrically connected to the peripheral wirings 3110 of the first structure 3100 and extending into the second structure 3200. The through-wiring 3245 may be arranged outside the gate stack structure 3210, and may be extend through the gate stack structure 3210. Each of the semiconductor chips 2200 may further include an input/output pad 2210 (see FIG. 12) that is electrically connected to the peripheral wirings 3110 of the first structure 3100.

As described above, by including a landing pad having a pad portion side by side or coplanar with a second substrate and a ring-shaped inner substrate insulating layer structure surrounding the pad portion, holes for forming a plurality of support structures and gate contact plugs may be formed in the same etching process. Thus, a semiconductor device having improved productivity and a data storage system including the same may be provided.

In addition, lower ends of the gate contact plugs may be formed in a pad portion to prevent contact with a barrier layer. Thus, a semiconductor device having improved electrical characteristics and a data storage system including the same may be provided.

While some example embodiments have been shown and described above, it will be apparent to those skilled in the art that modifications and variations could be made without departing from the scope of the present inventive concepts as defined by the appended claims.

What is claimed is:

1. A semiconductor device comprising:

a first semiconductor structure including a first substrate, circuit devices on the first substrate, and a lower interconnection structure connected to the circuit devices; and a second semiconductor structure on the first semiconductor structure, the second semiconductor structure comprising:

a second substrate having a first region and a second region;

a substrate insulating layer that extends through the second substrate;

a landing pad that extends through the substrate insulating layer;

gate electrodes spaced apart from each other and stacked on the first region in a first direction and extending with different lengths in a second direction on the second region, each of the gate electrodes including a gate pad region on the second region and having an exposed upper surface; and a gate contact plug that extends through the gate pad region of at least one of the gate electrodes and extends into the landing pad in the first direction, wherein the landing pad includes a pad portion that is surrounded by an internal side surface of the substrate insulating layer, and wherein the landing pad includes a via portion that extends from the pad portion to the lower interconnection structure of the first semiconductor structure.

2. The semiconductor device of claim 1, wherein the pad portion is disposed on a level the same as or higher than a level of a lower surface of the second substrate, and wherein the internal side surface of the substrate insulating layer is in contact with the pad portion of the landing pad and an external side surface of the substrate insulating layer is in contact with the second substrate in the second region.

3. The semiconductor device of claim 1, wherein the substrate insulating layer has an annular shape in the second region.

4. The semiconductor device of claim 1, wherein the substrate insulating layer separates the landing pad and the second substrate from each other.

5. The semiconductor device of claim 1, wherein a lower surface of the substrate insulating layer is at a level that is lower than a level of a lower surface of the second substrate.

6. The semiconductor device of claim 1, wherein the pad portion of the landing pad is coplanar with the second substrate in the first direction, and wherein the via portion of the landing pad is at a level that is lower than a lower surface of the second substrate.

7. The semiconductor device of claim 1, wherein the landing pad includes tungsten (W), copper (Cu), aluminum (Al), molybdenum (Mo), or alloys thereof.

8. The semiconductor device of claim 1, further comprising:

a channel structure on the first region and extending in the first direction through the gate electrodes, the channel structure including a channel layer, wherein an upper surface of the channel structure is at substantially the same level as an upper surface of the gate contact plug.

9. The semiconductor device of claim 8, wherein a lower surface of the channel structure is at substantially the same level as a lower surface of the gate contact plug.

10. The semiconductor device of claim 1, wherein the second semiconductor structure comprises:

a horizontal insulating layer that is parallel to lower portions of the gate electrodes on a portion of the second substrate; and a horizontal conductive layer on the horizontal insulating layer, wherein the pad portion of the landing pad includes a first pad portion coplanar in the first direction with the second substrate, a second pad portion coplanar in the first direction with the horizontal insulating layer, and a third pad portion coplanar in the first direction with the horizontal conductive layer, and wherein the second and third pad portions are a dummy pad region.

11. The semiconductor device of claim 10, wherein:

the second pad portion includes the same material as the horizontal insulating layer, and the second pad portion surrounds the gate contact plug and is spaced apart from the horizontal insulating layer.

12. The semiconductor device of claim 1, wherein:

the substrate insulating layer includes an inner substrate insulating layer that extends into the second substrate in the second region, and an outer substrate insulating layer, outside the second substrate in the second region, and the semiconductor device further comprises:

an outer landing pad that extends through the outer substrate insulating layer; and a through-contact plug that is spaced apart from the gate electrodes and that extends into the outer landing pad in the first direction.

13. The semiconductor device of claim 12, wherein the outer landing pad includes a pad portion that is surrounded by the outer substrate insulating layer, and a via portion that extends from the pad portion to the lower interconnection structure, and a lower end of the through-contact plug is in contact with the pad portion and is at a level that is higher than a level of the via portion.

14. A semiconductor device comprising:

a first semiconductor structure including a first substrate, circuit devices on the first substrate, and a lower interconnection structure connected to the circuit devices; and a second semiconductor structure on the first semiconductor structure, the second semiconductor structure comprising:

a second substrate having a first region and a second region;

an inner substrate insulating layer having a ring shape and extending through the second substrate;

gate electrodes spaced apart from each other and stacked on the first region in a first direction and extending with different lengths in a second direction, each of the gate electrodes including a gate pad region having an exposed upper surface on the second region; and a gate contact plug extending in the first direction through the gate pad region of each of the gate electrodes through a space within the ring shape of the inner substrate insulating layer.

15. The semiconductor device of claim 14, wherein a width of the inner substrate insulating layer is substantially uniform along a perimeter of the ring shape.

16. The semiconductor device of claim 14, wherein the ring shape of the inner substrate insulating layer is a circular ring shape, a polygonal ring shape, or a corner-rounded polygonal ring shape.

17. The semiconductor device of claim 14, wherein an external side surface of the inner substrate insulating layer is in contact with the second substrate, an internal side surface of the inner substrate insulating layer is in contact with a landing pad coplanar with the second substrate in the first direction, the gate contact plug is in contact with the landing pad, and the inner substrate insulating layer separates the second substrate and the landing pad from each other.

18. The semiconductor device of claim 14, further comprising:

a plurality of support structures extending in the first direction through the gate electrodes, and adjacent to the gate contact plug, wherein in a plan view, the inner substrate insulating layer surrounds the gate contact plug and is between the plurality of support structures and the gate contact plug.

19. A data storage system comprising:

a semiconductor storage device including a first semiconductor structure, a second semiconductor structure, an input/output pad, the first semiconductor structure including a first substrate, circuit devices on the first substrate, and a lower interconnection structure connected to the circuit devices, the second semiconductor structure on the first semiconductor structure, the input/output pad electrically connected to the circuit devices; and a controller electrically connected to the semiconductor storage device through the input/output pad and configured to control the semiconductor storage device, wherein the second semiconductor structure comprises:

a second substrate having a first region and a second region;

an inner substrate insulating layer having a ring shape and extending through the second substrate;

gate electrodes spaced apart from each other and stacked on the first region in a first direction and having different lengths in a second direction, each of the gate electrodes including a gate pad region on the second region having an exposed upper surface; and a gate contact plug extending in the first direction through the gate pad region of at least one of the gate electrodes through a space within the ring shape of the inner substrate insulating layer.

20. The data storage system of claim 19, further comprising:

a landing pad including a pad portion, surrounded by an internal side surface of the inner substrate insulating layer, and a via portion extending from the pad portion to the lower interconnection structure, wherein the gate contact plug is in contact with the pad portion, and wherein a lower end of the gate contact plug is at a level that is higher than a level of the via portion.

\* \* \* \* \*